(12) United States Patent
Funyuu et al.

(10) Patent No.: US 9,553,269 B2
(45) Date of Patent: Jan. 24, 2017

(54) MATERIAL FOR ORGANIC ELECTRONICS, ORGANIC ELECTRONIC ELEMENT, ORGANIC ELECTROLUMINESCENT ELEMENT, DISPLAY ELEMENT USING ORGANIC ELECTROLUMINESCENT ELEMENT, ILLUMINATING DEVICE, AND DISPLAY DEVICE

(75) Inventors: Shigeaki Funyuu, Tsuchiura (JP); Kenichi Ishitsuka, Tsukuba (JP); Yousuke Hoshi, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 1270 days.

(21) Appl. No.: 13/499,667

(22) PCT Filed: Sep. 30, 2010

(86) PCT No.: PCT/JP2010/067087
§ 371 (c)(1),
(2), (4) Date: Mar. 30, 2012

(87) PCT Pub. No.: WO2011/040531
PCT Pub. Date: Apr. 7, 2011

(65) Prior Publication Data
US 2012/0181530 A1    Jul. 19, 2012

(30) Foreign Application Priority Data

Oct. 1, 2009    (JP) .................................. 2009-229483
Jan. 14, 2010    (JP) .................................. 2010-005846

(51) Int. Cl.
*H01L 51/50*    (2006.01)
*H01L 51/00*    (2006.01)
(Continued)

(52) U.S. Cl.
CPC ........... *H01L 51/0043* (2013.01); *C08G 61/12* (2013.01); *C08G 61/123* (2013.01); *C08G 65/18* (2013.01);
(Continued)

(58) Field of Classification Search
None
See application file for complete search history.

(56) References Cited

U.S. PATENT DOCUMENTS 4,624,999 A    11/1986    Jenekhe
7,358,660 B2    4/2008    Yamada et al.
(Continued)

FOREIGN PATENT DOCUMENTS

CN    1656855 A    8/2005
CN    1788068 A    6/2006
(Continued)

OTHER PUBLICATIONS

Office Action issued Sep. 3, 2013, in Japanese Patent Application No. 2011-534309.
(Continued)

*Primary Examiner* — Gregory Clark
(74) *Attorney, Agent, or Firm* — Fitch, Even, Tabin and Flannery LLP

(57) ABSTRACT

Provided is a material for organic electronics which can produce an organic electronic element capable of lowering the driving voltage or capable of performing stable driving for a long time. The material for organic electronics contains at least an ionic compound and a compound having a charge transporting unit (hereinafter, referred to as charge transporting compound), and the ionic compound is composed of a counter cation and a counter anion, while the counter cation is any one kind or two or more kinds selected from
(Continued)

H+, a carbocation, a nitrogen cation, an oxygen cation, and a cation having a transition metal.

22 Claims, 1 Drawing Sheet

(51) Int. Cl.
    *C08G 61/12*     (2006.01)
    *C08G 65/18*     (2006.01)
    *C08G 73/02*     (2006.01)
    *C08L 63/00*     (2006.01)
    *C09K 11/06*     (2006.01)
    *H05B 33/14*     (2006.01)

(52) U.S. Cl.
    CPC ............ *C08G 73/026* (2013.01); *C08L 63/00* (2013.01); *C09K 11/06* (2013.01); *H01L 51/0035* (2013.01); *H01L 51/0039* (2013.01); *H05B 33/14* (2013.01); *C08G 2261/1644* (2013.01); *C08G 2261/3142* (2013.01); *C08G 2261/3162* (2013.01); *C08G 2261/3246* (2013.01); *C08G 2261/342* (2013.01); *C09K 2211/1433* (2013.01); *H01L 51/5056* (2013.01); *H01L 51/5088* (2013.01)

(56) References Cited

U.S. PATENT DOCUMENTS

| 2003/0144465 | A1 | 7/2003 | Leenders et al. |
| 2007/0020479 | A1 | 1/2007 | Uetani |

FOREIGN PATENT DOCUMENTS

| CN | 1930921 | A | | 3/2007 | |
|---|---|---|---|---|---|
| EP | 1 304 750 | A2 | | 4/2003 | |
| EP | 1 501 337 | A1 | | 1/2005 | |
| EP | 1 725 079 | A1 | | 11/2006 | |
| JP | 11-135258 | A | | 5/1999 | |
| JP | 2000-208254 | A | | 7/2000 | |
| JP | 2002-056973 | A | | 2/2002 | |
| JP | 2003-007763 | A | | 1/2003 | |
| JP | 2003-217862 | A | | 7/2003 | |
| JP | 2003-217863 | A | | 7/2003 | |
| JP | 2003-257674 | A | | 9/2003 | |
| JP | 2004-199935 | A | | 7/2004 | |
| JP | 3643433 | B2 | | 4/2005 | |
| JP | 2005-179634 | A | | 7/2005 | |
| JP | 2007-103381 | A | | 4/2007 | |
| JP | 2007-514298 | A | | 5/2007 | |
| JP | 2007-165606 | A | | 6/2007 | |
| JP | 2008-078374 | A | | 4/2008 | |
| JP | 2008-135741 | A | | 6/2008 | |
| JP | 2008-227483 | A | | 9/2008 | |
| JP | 2009-074074 | A | | 4/2009 | |
| KR | 10-2005-0007358 | B1 | | 1/2005 | |
| KR | 10-2005-0014007 | A | | 2/2005 | |
| TW | I281491 | B | | 5/2007 | |
| WO | WO 01/67823 | A1 | | 9/2001 | |
| WO | WO 03/094578 | A1 | | 11/2003 | |
| WO | WO 2005/042621 | A1 | | 5/2005 | |
| WO | WO 2005/053056 | | * | 6/2005 | ............ H01L 51/30 |
| WO | WO 2005/089024 | A1 | | 9/2005 | |
| WO | WO 2007/126929 | | * | 11/2007 | ............ H01L 51/00 |
| WO | WO 2007/126929 | A2 | | 11/2007 | |
| WO | WO 2008/073440 | A2 | | 6/2008 | |
| WO | WO 2008/099926 | A1 | | 8/2008 | |
| WO | WO 2008/140657 | A1 | | 11/2008 | |
| WO | 2009/107497 | A1 | | 9/2009 | |

OTHER PUBLICATIONS

Baldo et al. "Very high-efficiency green organic light-emitting devices based on elecrophosphorescence" Applied Physics Letters, vol. 75, No. 1, Jul. 5, 1999, pp. 4-6.
Extended European Search Report issued Feb. 1, 2013, in European Patent Application No. 10820646.7.
CN office action of Appln. No. 201080045523.8 dated Jun. 4, 2015.
Baldo et al., "High-efficiency fluorescent organic light-emitting devices using a phosphorescent sensitizer". Nature, vol. 403, pp. 750-753 (2000).
Baldo et al., "Highly efficient phosphorescent emission from organic electroluminescent devices". Nature, vol. 395, pp. 151-154 (1998).
Muller et al., "Multi-colour organic light-emitting displays by solution processing". Nature, vol. 421, pp. 829-833 (2003).
Bayer et al., "Crosslinkable hole-transport materials for preparation of multilayer organic light emitting devices by spin-coating". Macromolecular Rapid Communication 20, No. 4, pp. 224-228 (1999).
KR office action of Appln. No. 10-2015-7011559 dated Jun. 12, 2015 with partial English translation.
CN office action of Appln. No. 201080045523.8 dated Dec. 25, 2014 with English translation.
Office Action issued May 27, 2014, in Korean Patent Application No. 2014-7009990.
Office Action issued May 20, 2014, in Japanese Patent Application No. 2011-534309.
Office Action issued Jun. 17, 2014, in European Patent Application No. 10 820 646.7.
Submission of Information in Japanese Patent Application No. 2011-534309, communicated Jun. 25, 2013.
Office Action issued Aug. 19, 2014, in Taiwanese Patent Application No. 099133368.
Office Action issued Oct. 29, 2014, in Korean Patent Application No. 10-2012-7011066.
Office Action of counterpart Korean Appln. No. 2015-7020266 dated Oct. 20, 2015 with English translation.
Office Action of counterpart Korean Appln. No. 2015-7020267 dated Oct. 20, 2015 with English translation.
Office Action of EP Appln. No. 10 820 646.7-1555 dated Dec. 18, 2015 in English in counterpart application.
Office Action in counterpart Korean Appln. No. 2012-7011066 dated Jan. 27, 2016 with English translation.
Office Action of Korean Appln. No. 10-2012-7011066 Dec. 25, 2015.
Office Action of Korean Appln. No. 10-2012-7011066 Sep. 25, 2015.
Office Action in counterpart Korean Appln. No. 10-2015-7011559 dated Apr. 27, 2016 with English translation.
Office Action in counterpart Indonesian Appln. No. W00201201538 dated Apr. 25, 2016 with English translation.
English translation of International Preliminary Report on Patentability dated May 8, 2012, in International Patent Application No. PCT/JP2010/067087.
Office Action issued Dec. 19, 2012, in Japanese Patent Application No. 2011-534309.
Office Action dated Mar. 18, 2014, in Chinese Patent Application No. 201080045523.8.
Office Action of Korean Appln. No. 10-2015-7011559 dated Sep. 1, 2016 with English translation.
Office Action of Korean Appln. No. 10-2015-7020266 dated Aug. 31, 2016 with English translation.
Office Action of Korean Appln. No. 10-2015-7020267 dated Aug. 31, 2016 with English translation.
Office Action of counterpart EP Appln. No. 10 820 646.7 Dated Nov. 22, 2016 in English.

* cited by examiner

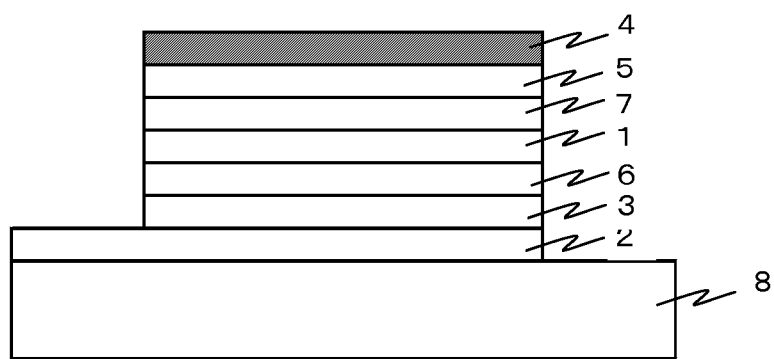

MATERIAL FOR ORGANIC ELECTRONICS, ORGANIC ELECTRONIC ELEMENT, ORGANIC ELECTROLUMINESCENT ELEMENT, DISPLAY ELEMENT USING ORGANIC ELECTROLUMINESCENT ELEMENT, ILLUMINATING DEVICE, AND DISPLAY DEVICE

TECHNICAL FIELD

The present invention relates to a material for organic electronics, an organic electronic element using the material for organic electronics, an organic electroluminescent element (hereinafter, also referred to as an organic EL element), a display element using the organic electroluminescent element, an illuminating device, and a display device.

BACKGROUND ART

An organic electronic element is an element which performs an electrical operation using an organic substance, and is expected to exhibit features such as energy saving, low price, and flexibility. Thus, attention is being paid to the organic electronics as a technology to be substituted for the conventional inorganic semiconductors containing silicon as a main component.

Among organic electronic elements, organic EL elements have attracted attention for their use in, for example, large-sized solid state light sources as the substitute for incandescent lamps and gas-filled lamps. Furthermore, organic EL elements are also attracting attention as the most promising self-luminescent displays that will be substituted for liquid crystal displays (LCD) in the field of flat panel displays (FPD), and productization of the organic EL elements is in progress.

Organic EL elements are broadly classified into two classes such as low molecular weight organic EL elements and high molecular weight organic EL elements, in terms of the material and film-forming method used. High molecular weight organic EL elements are such that the organic material is composed of a polymeric material, and are capable of simplified film formation such as printing or ink-jetting as compared with low molecular weight organic EL elements which require a vacuum system for film formation. Therefore, the high molecular weight organic EL elements are indispensable elements for the large screen organic EL displays of the future.

Active research has been conducted hitherto on both the low molecular weight organic EL elements and the high molecular weight EL elements, but there are still serious problems of low light emission efficiency and short element service life. In an attempt to address these problems, multilayering has been adopted in the low molecular weight organic EL elements.

An example of a multilayered organic EL element is presented in FIG. 1. In FIG. 1, a layer that is in charge of light emission is described as a light emitting layer 1, and if the organic EL element has other layers, a layer that is in contact with an anode 2 is described as a hole injection layer 3, while a layer that is in contact with the cathode 4 is described as an electron injection layer 5. Furthermore, when another layer is present between the light emitting layer 1 and the hole injection layer 3, the layer is described as a hole transport layer 6. When another layer is present between the light emitting layer 1 and the electron injection layer 5, the layer is described as an electron transport layer 7. Meanwhile, reference numeral 8 in FIG. 1 represents a substrate.

In a low molecular weight organic EL element, since film formation is carried out by a vapor deposition method, multilayer can be easily achieved by performing vapor deposition while sequentially changing the compound used. On the other hand, in a high molecular weight organic EL element, since film formation is carried out using a wet process such as printing or ink-jetting, in order to achieve multilayering, a method in which the layer that has previously been formed does not change when a new layer is formed, is needed. The reason why multilayering is difficult in high molecular weight organic EL elements is that a lower layer which has been formed earlier is dissolved out at the time of the formation of an upper layer.

In order to take measures to this problem, investigation has been conducted on the use of compounds having significantly different solubilities. As a representative example thereof, there may be mentioned an element having a two-layer structure including a hole injection layer formed from polythiophene:polystyrene sulfonic acid (PEDOT:PSS), which is formed by using an aqueous dispersion liquid, and a light emitting layer which is formed by using an aromatic organic solvent such as toluene. In this case, since the PEDOT:PSS layer does not dissolve in toluene, it is possible to produce a two-layer structure. However, it is difficult to eliminate water, and this causes deterioration of the characteristics of the organic electronic element. Furthermore, drying at a high temperature for a long time is required for the removal of water, so that production of an organic electronic element on a resin substrate becomes difficult, or restrictions are imposed on the process such as the pressure reduction conditions.

Furthermore, as an example of using an organic solvent, there has been disclosed a method of selecting a solvent that does not affect a lower layer that has been formed earlier (see Patent Document 1).

However, because the solvent that can be used in such a method is limited to a solvent which does not dissolve the lower layer, there is a problem that the selection range for the material is narrow. Further, a certain extent of erosion of the lower layer occurs at the time of the formation of an upper layer.

As another method for constructing a multilayer structure, a method of using a crosslinking reaction has been disclosed. Patent Document 2 discloses a method of crosslinking a triphenylamine-containing ether polyether ketone by irradiating the compound with ultraviolet radiation, and thereby insolubilizing the compound. In order to achieve sufficient insolubilization by this method, ultraviolet irradiation for a long time is required, and there is a problem that decomposition of triphenylamine and the like occurs.

In addition, Patent Document 3, Patent Document 4, Non-Patent Document 1 and Non-Patent Document 2 disclose multilayering as a result of the crosslinking of oxetane groups. In these methods, since a photoinitiator is used, there is a concern about deterioration by light. Furthermore, sufficient insolubilization does not proceed at a low temperature, and there occurs a problem that the application of resin substrates which require low temperature curing is restricted, or a problem that at the time of the formation of an upper layer, the upper layer and the lower layer are mixed with each other, and the organic EL characteristics are deteriorated. Moreover, the photoinitiators used in those methods are general iodonium salts or sulfonium salts, and there is a concern about the effect of the salts on the EL characteristics.

On the other hand, in order to achieve a decrease in the driving voltage, which is an unsolved problem of organic EL elements, an investigation has been conducted on the use of an iodonium salt or sulfonium salt having the a similar structure in the hole transport layer or in the light emitting layer.

Patent Document 5 discloses an ionic compound, but this has the same structure as that of the photoinitiator described above, and there is a concern about its effect on the characteristics of organic EL elements. Further, there are no descriptions on crosslinking or lamination.

Patent Document 6 discloses a polymeric illuminant composition containing a polymeric illuminant and an ion couple. According to this literature, there is a description that when the composition has an ion couple having a particular structure, a luminescent element having a much longer service life may be obtained; however, there are no descriptions on the injection and transport of charges. Further, there are no descriptions on crosslinking or lamination.

On the other hand, for the purpose of increasing the efficiency of organic EL elements, development of phosphorescent organic EL elements is also actively attempted. In the phosphorescent organic EL elements, not only singlet state energy but also triplet state energy can be utilized, and the internal quantum yield can be increased up to 100% in principle. In a phosphorescent organic EL element, phosphorescence emission is extracted by doping a metal complex-based luminescent material containing a heavy metal such as platinum or iridium as a dopant emitting phosphorescence, into a host material (see Non-Patent Document 3, Non-Patent Document 4, and Non-Patent Document 5).

Patent Document 7 disclose a phosphorescent organic EL element in which multilayering is achieved by polymerizing a polymerizable compound. In the organic EL element, since a polymerization initiator is contained in a layer that is adjacent to a light emitting layer, it is speculated that when the polymerization initiator or a decomposition product thereof reacts with the compound of the light emitting layer, the service life of the organic EL element is shortened. For this reason, a structure which does not contain a polymerization initiator in a layer that is adjacent to the light emitting layer has been suggested.

CITATION LIST

Patent Documents

Patent Document 1: Japanese Patent Application Laid-Open (JP-A) No. 2003-07763
Patent Document 2: Japanese Patent No. 3643433
Patent Document 3: JP-A No. 2004-199935
Patent Document 4: Japanese Patent Application National Publication No. 2007-514298
Patent Document 5: international publication WO 05/089024
Patent Document 6: JP-A No. 2005-179634
Patent Document 7: JP-A No. 2008-227483

Non-Patent Documents

Non-Patent Document 1: Macromol. Rapid Commun., 20, 224-228 (1999)
Non-Patent Document 2: Nature, 421 (2003) 829-833
Non-Patent Document 3: M. A. Baldo et al., Nature, Vol. 395, p. 151 (1998)
Non-Patent Document 4: M. A. Baldo et al., Applied Physics Letters, Vol. 75, p. 4 (1999)
Non-Patent Document 5: M. A. Baldo et al., Nature, Vol. 403, p. 750 (2000)

SUMMARY OF THE INVENTION

Problem to be Solved by the Invention

However, in regard to the suggestion of adopting a structure which does not contain a polymerization initiator in a layer that is adjacent to the light emitting layer, since a layer containing a polymerization initiator is not disposed adjacent to the light emitting layer, in order to incorporate the polymerization initiator into a lower layer and to thereby cure a layer containing a polymerizable compound in an upper layer, it is necessary to select a solvent which does not dissolve the lower layer at the time of the formation of the upper layer, and there have been limitations on the material that can be used. Furthermore, there is a problem that at the time of the formation of the upper layer, the upper layer and the lower layer are mixed, and the polymerization initiator is incorporated into the upper layer, resulting in a decrease in the element service life.

The present invention was made in view of the problems described above, it is an object of the present invention to provide a material for organic electronics which can produce an organic electronic element capable of lowering the driving voltage or capable of performing stable driving for a long time.

It is another object of the present invention to provide a material for organic electronics capable of low temperature curing by a coating method, and a multilayer organic electronic element using the material.

Furthermore, it is another object of the present invention to provide an organic EL element having a light emission efficiency and a luminescence lifetime that are superior to the conventional cases, a display element using the organic EL element, an illuminating device, and a display device.

Means for Solving Problem

The inventors of the present invention conducted a thorough investigation, and as a result, they found that the problems described above can be solved by including an ionic compound having a specific counter cation, which is neither iodonium nor sulfonium that is used as general photoinitiator, and a charge transporting compound. Thus, the inventors finally completed the present invention.

Furthermore, the inventors conducted a thorough investigation, and as a result, they found that when an organic EL element is produced by using a mixture containing a compound having a polymerizable substituent for each of two adjacent layers in a multilayer structure, the light emission efficiency and luminescence lifetime of the organic EL element can be improved. Thus, the inventors finally completed the present invention.

That is, the present invention is characterized by the following items (1) to (38).

(1) A material for organic electronics containing at least an ionic compound and a compound having a charge transporting unit (hereinafter, referred to as a charge transporting compound),
wherein the ionic compound is composed of a counter cation and a counter anion, and the counter cation is any one kind or two or more kinds selected from H⁺, a carbocation, a nitrogen cation, an oxygen cation, and a cation having a transition metal.

(2) The material for organic electronics as set forth in the item (1), wherein the carbocation is a tertiary carbocation.

(3) The material for organic electronics as set forth in the item (1) or (2), wherein the nitrogen cation is a tertiary or quaternary nitrogen cation.

(4) The material for organic electronics as set forth in any one of the items (1) to (3), wherein the counter anion is any one kind or two or more kinds selected from fluorophosphoric acid ions, fluorinated alkylfluorophosphoric acid ions, boric acid ions, and fluoroantimonic acid ions.

(5) The material for organic electronics as set forth in any one of the items (1) to (4), wherein the charge transporting compound has at least one or more structures selected from triarylamine, carbazole, and thiophene.

(6) The material for organic electronics as set forth in any one of the items (1) to (4), wherein the charge transporting compound is a polymer or oligomer including a repeating unit represented by any one of the following formulas (1a) to (7a) and having hole transportability:

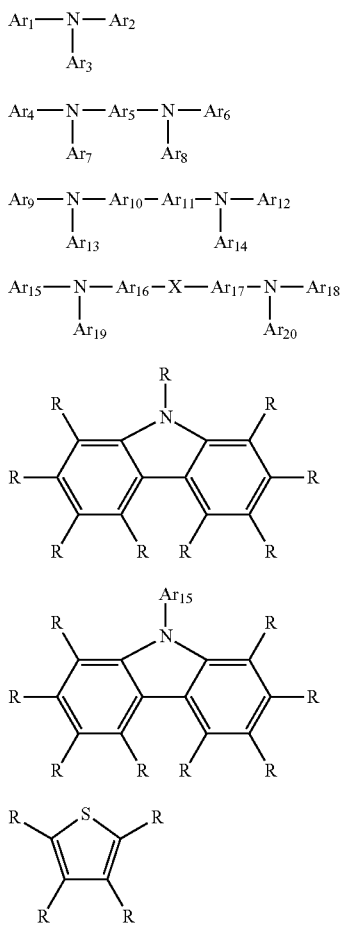

wherein $Ar_1$ to $Ar_{20}$ each independently represent an aryl group or heteroaryl group having 2 to 30 carbon atoms, or a substituted or unsubstituted arylene group or heteroarylene group. Here, the aryl group means an atomic group obtained by excluding one hydrogen atom from an aromatic hydrocarbon, and the heteroaryl group means an atomic group obtained by excluding one hydrogen atom from an aromatic compound having a heteroatom, or represents R. R's each independently represent $-R^1$, $-OR^2$, $-SR^3$, $-OCOR^4$, $-COOR^5$, $-SiR^6R^7R^8$, or any one of formulas (2a) to (4a) (wherein $R^1$ to $R^8$ each independently represent a hydrogen atom, a linear, cyclic or branched alkyl group having 1 to 22 carbon atoms, or an aryl group or heteroaryl group having 2 to 30 carbon atoms). Here, the arylene group means an atomic group obtained by excluding two hydrogen atoms from an aromatic hydrocarbon, and the heteroarylene group means an atomic group obtained by excluding two hydrogen atoms from an aromatic compound having a heteroatom. X represents group obtained by further removing one hydrogen atom from a group having one or more hydrogen atoms among the groups of R.

(7) The material for organic electronics as set forth in any one of the items (1) to (6), wherein the charge transporting compound has one or more polymerizable substituents.

(8) The material for organic electronics as set forth in the item (7), wherein the polymerizable substituent is any one or more selected from oxetane, epoxy and vinyl ether.

(9) The material for organic electronics as set forth in any one of the items (1) to (8), further containing a solvent.

(10) The material for organic electronics as set forth in any one of the items (1) to (9), wherein the ionic compound is an electron-accepting compound, and the charge transporting compound is capable of one-electron oxidation.

(11) An organic electronic element having a layer formed by applying the material for organic electronics as set forth in any one of the items (1) to (10) on a substrate.

(12) The organic electronic element as set forth in the item (11), wherein the formed layer is insolubilized.

(13) The organic electronic element as set forth in the item (12), wherein film formation is further carried out on the insolubilized layer, and thereby, multilayering is achieved.

(14) The organic electronic element as set forth in any one of the items (11) to (13), wherein the substrate is a resin film.

(15) An organic electroluminescent element having a layer formed from the material for organic electronics as set forth in any one of the items (1) to (10).

(16) An organic electroluminescent element formed by laminating at least a substrate, an anode, a hole injection layer, a polymerized layer, a light emitting layer, and a cathode, wherein the polymerized layer is a layer formed from the material for organic electronics as set forth in any one of the items (1) to (10).

(17) An organic electroluminescent element formed by laminating at least a substrate, an anode, a polymerized layer, a hole transport layer, a light emitting layer, and a cathode, wherein the polymerized layer is a layer formed from the material for organic electronics as set forth in any one of the items (1) to (10).

(18) The organic electroluminescent element as set forth in any one of the items (15) to (17), wherein the color of the emitted light of the organic electroluminescent element is white.

(19) An organic electroluminescent element having a multilayer structure, wherein two adjacent layers in the multilayer structure are formed by a coating method, respectively using a mixture containing a hole transporting compound having a polymerizable substituent, and the hole transporting compounds are respectively polymerized.

(20) The organic electroluminescent element as set forth in the item (19), wherein the polymerizable substituent is any one or more selected from an epoxy group, an oxetane group, and a vinyl ether group.

(21) The organic electroluminescent element as set forth in any one of the items (19) to (20), wherein the hold transporting compound contains at least an arylamine, carbazole, or thiophene skeleton.

(22) The organic electroluminescent element as set forth in any one of the items (19) to (21), wherein the hole transporting compound is an oligomer or polymer having a number average molecular weight of 1000 or greater.

(23) The organic electroluminescent element as set forth in any one of the items (19) to (22), wherein a polymerization initiator is incorporated into only the layer closer to the anode between the two adjacent two layers.

(24) The organic electroluminescent element as set forth in the item (23), wherein the polymerization initiator is an ionic compound having a counter cation selected from the group consisting of a carbocation, a nitrogen cation, an oxygen cation, and a cation having a transition metal.

(25) The organic electroluminescent element as set forth in any one of the items (19) to (24), wherein the two adjacent layers constitute any one of the combination of a hole injection layer and a hole transport layer, and the combination of a hole transport layer and a light emitting layer.

(26) The organic electroluminescent element as set forth in the item (25), wherein the light emitting layer contains a metal complex.

(27) The organic electroluminescent element as set forth in any one of the items (24) to (26), wherein the ionic compound is an electron-accepting compound, and the hole transporting compound is capable of one-electron oxidation.

(28) The organic electroluminescent element as set forth in any one of the items (19) to (27), wherein the substrate of the organic electroluminescent element is a resin film.

(29) The organic electroluminescent element as set forth in any one of the items (19) to (28), wherein the color of the emitted light of the organic electroluminescent element is white.

(30) The organic electroluminescent element as set forth in any one of the items (16) to (18) or any one of the items (19) to (27), wherein the substrate of the organic electroluminescent element is a flexible substrate.

(31) A display element including the organic electroluminescent element as set forth in any one of the items (15) to (20) or any one of the items (19) to (30).

(32) An illuminating device including the organic electroluminescent element as set forth in any one of the items (15) to (20) or any one of the items (19) to (30).

(33) A display device including the illuminating device as set forth in the item (32), and a liquid crystal element as a display unit.

The disclosure of the present application is related to the subject matters of Japanese Patent Application No. 2009-229483 filed in Japan on Oct. 1, 2009, and Japanese Patent Application No. 2010-5846 filed in Japan on Jan. 14, 2010, the disclosures of which are incorporated herein by reference.

Effect of the Invention

According to the present invention, there can be provided a material for organic electronics which can produce an organic electronic element capable of lowering the driving voltage or capable of performing stable driving for a long time, and is capable of low temperature curing by a coating method; a multilayered organic electronic element using the material; an organic electroluminescent element; a display element; and an illuminating device. That is, when an ionic compound and a charge transporting compound are incorporated, an organic electronic element, particularly an organic EL element, which is capable of lowering of the driving voltage or capable of performing stable driving for a long time, can be obtained.

Furthermore, according to the present invention, an organic EL element having a multilayer structure can be obtained by a coating method, an organic EL element having excellent light emission efficiency or an excellent luminescence lifetime can be provided, and a display element, an illuminating device and a display device having those characteristics can be provided by using the organic EL element.

BRIEF DESCRIPTION OF THE DRAWINGS

FIG. 1 is a schematic diagram showing an example of a multilayered organic EL element.

BEST MODES FOR CARRYING OUT THE INVENTION

<Material for Organic Electronics>

The material for organic electronics of the present invention is a material for organic electronics containing at least an ionic compound, and a compound having a charge transporting unit (hereinafter, referred to as a charge transporting compound), in which the ionic compound is composed of a counter cation and a counter anion, while the counter cation is any one kind or two or more kinds selected from $H^+$, a carbocation, a nitrogen cation, an oxygen cation, and a cation having a transition metal.

Hereinafter, the various components of the material for organic electronics of the present invention will be described in detail.

[Ionic Compound]

The ionic compound used in the present invention is composed of the counter cation and counter anion described above. The counter cation is any one kind or two or more kinds selected from $H^+$, a carbocation, a nitrogen cation, an oxygen cation, and a cation having a transition metal. The various cations will be explained below.

(Carbocation)

Examples of the carbocation include a primary carbocation, a secondary carbocation, and a tertiary carbocation. Among these, a secondary carbocation and a tertiary carbocation are preferred from the viewpoint of the stability of the material and from the viewpoint that when the carbocations are combined with the anions that will be described below, the combinations form polymerization initiators capable of curing at a low temperature. A tertiary carbocation is most preferred. Further examples include a triphenylcarbonium cation, a tri(methylphenyl)carbonium cation, a tri(dimethylphenyl)carbonium cation, and the like.

(Nitrogen Cation)

Examples of the nitrogen cation include $NH_4^+$, a primary nitrogen cation, a secondary nitrogen cation, a tertiary nitrogen cation, and a quaternary nitrogen cation. Here, the primary nitrogen cation represents a compound in which $N^+$ is bonded to three hydrogen atoms, and the other bond is bonded to an atom other than hydrogen. The secondary nitrogen cation represents a compound in which $N^+$ is bonded to two hydrogen atoms, and the other bonds are bonded to atoms other than hydrogen. The tertiary nitrogen cation represents a compound in which $N^+$ is bonded to one hydrogen atom, and the other bonds are bonded to atoms other than hydrogen. The quaternary ammonium cation represents a compound in which $N^+$ is bonded to atoms other than hydrogen.

Specific examples include ammoniums such as n-butylammonium, dimethylammonium, trimethylammonium, triethylammonium, triisopropylammonium, tri-n-butylammonium, tetramethylammonium, tetraethylammonium, tetra-n-butylammonium, N,N-dimethylcyclohexylammonium, tetramethylammonium, ethyltrimethylammonium, diethyldimethylammonium, triethylmethylammonium, tetraethylammonium, trimethyl-n-propylammonium, trimethylisopropylammonium, trimethyl-n-butylammonium, trimethylisobutylammonium, trimethyl-t-butylammonium, trimethyl-n-hexylammonium, dimethyldi-n-propylammonium, dimethyldiisopropylammonium, dimethyl-n-propylisopropylammonium, methyltri-n-propylammonium, and methyltriisopropylammonium.

Further examples include aniliniums such as N-methylanilinium, N,N-dimethylanilinium, N,N-dimethyl-4-methylanilinium, N,N-diethylanilinium, N,N-diphenylanilinium, and N,N,N-trimethylanilinium.

Further examples include pyridiniums such as pyridinium, N-methylpyridinium, N-butylpyridinium, N-methyl-4-methylpyridinium, N-benzylpyridinium, 3-methyl-N-butylpyridinium, 2-methylpyridinium, 3-methylpyridinium, 4-methylpyridinium, 2,3-dimethylpyridinium, 2,4-dimethylpyridinium, 2,6-dimethylpyridinium, 3,4-dimethylpyridinium, 3,5-dimethylpyridinium, 2,4,6-trimethylpyridinium, 2-fluoropyridinium, 3-fluoropyridinium, 4-fluoropyridinium, 2,6-difluoropyridinium, 2,3,4,5,6-pentafluoropyridinium, 2-chloropyridinium, 3-chloropyridinium, 4-chloropyridinium, 2,3-dichloropyridinium, 2,5-dichloropyridinium, 2,6-dichloropyridinium, 3,5-dichloropyridinium, 3,5-dichloro-2,4,6-trifluoropyridinium, 2-bromopyridinium, 3-bromopyridinium, 4-bromopyridinium, 2,5-dibromopyridinium, 2,6-dibromopyridinium, 3,5-dibromopyridinium, 2-cyanopyridinium, 3-cyanopyridinium, 4-cyanopyridinium, 2-hydroxypyridinium, 3-hydroxypyridinium, 4-hydroxypyridinium, 2,3-dihydroxypyridinium, 2,4-dihydroxypyridinium, 2-methyl-5-ethylpyridinium, 2-chloro-3-cyanopyridinium, 4-carboxamidopyridinium, 4-carboxaldehydepyridinium, 2-phenylpyridinium, 3-phenylpyridinium, 4-phenylpyridinium, 2,6-diphenylpyridinium, 4-nitropyridinium, 4-methoxypyridinium, 4-vinylpyridinium, 4-mercaptopyridinium, 4-t-butylpyridinium, 2,6-di-t-butylpyridinium, 2-benzylpyridinium, 3-acetylpyridinium, 4-ethylpyridinium, pyridinium-2-carboxylate, pyridinium-4-carboxylate, and 2-benzoylpyridinium.

Further examples include imidazoliums such as imidazolium, 1-methyl-imidazolium, 1-ethyl-3-methylimidazolium, 1-propyl-3-methylimidazolium, 1-butyl-3-methylimidazolium, 1-hexyl-3-methylimidazolium, 1-methyl-3-octylimidazolium, 1-methyl-N-benzylimidazolium, 1-methyl-3-(3-phenylpropyl)imidazolium, 1-butyl-2,3-dimethylimidazolium, and 1-ethyl-2,3-dimethylimidazolium.

Further examples include pyrrolidiniums such as 1-ethyl-1-methylpyrrolidinium, and 1-butyl-1-methylpyrrolidinium.

Further examples include quinoliniums such as quinolinium and isoquinolinium. Further examples include pyrrolidiniums such as N,N-dimethylpyrrolidinium, N-ethyl-N-methylpyrrolidinium, and N,N-diethylpyrrolidinium. Other examples also include diimmoniums and aminiums described in WO 03/005076 and WO 03/097580. Among these, a tertiary nitrogen cation and a quaternary nitrogen cation are preferred from the viewpoint of stability and from the viewpoint that when the nitrogen cations are combined with the anions that will be described below, the combinations form initiators capable of curing at a low temperature. A tertiary nitrogen cation is most preferred.

(Oxygen Cation)

Examples of the oxygen cation include trimethyloxonium, triethyloxonium, tripropyloxonium, tributyloxonium, trihexyloxonium, triphenyloxonium, pyrylium, chromenylium, and xanthylium.

(Cation Having Transition Metal)

Examples of the cation having a transition metal include Cr compounds such as $(\eta5\text{-cyclopentadienyl})(\eta6\text{-tluene})Cr^+$, $(\eta5\text{-cyclopentadienyl})(\eta6\text{-xylene})Cr^+$, $(\eta5\text{-cyclopentadienyl})(\eta6\text{-1-methylnaphthalene})Cr^+$, $(\eta5\text{-cyclopentadienyl})(\eta6\text{-cumene})Cr^+$, $(\eta5\text{-cyclopentadienyl})(\eta6\text{-mesitylene})Cr^+$, $(\eta5\text{-cyclopentadienyl})(\eta6\text{-pyrene})Cr^+$, $(\eta5\text{-fluorenyl})(\eta6\text{-cumene})Cr^+$, $(\eta5\text{-indenyl})(\eta6\text{-cumene})Cr^+$, $bis(\eta6\text{-mesitylene})Cr^{2+}$, $bis(\eta6\text{-xylene})Cr^{2+}$, $bis(\eta6\text{-cumene})Cr^{2+}$, $bis(\eta6\text{-toluene})Cr^{2+}$, $(\eta6\text{-toluene})(\eta6\text{-xylene})Cr^{2+}$, $(\eta6\text{-cumene})(\eta6\text{-naphthalene})Cr^{2+}$, $bis(\eta5\text{-cyclopentadienyl})Cr^+$, $bis(\eta5\text{-indenyl})Cr^+$, $(\eta5\text{-cyclopentadienyl})(\eta5\text{-fluorenyl})Cr^+$ and $(\eta5\text{-cyclopentadienyl})(\eta5\text{-indenyl})Cr^+$; and Fe compounds such as $(\eta5\text{-cyclopentadienyl})(\eta6\text{-toluene})Fe^+$, $(\eta5\text{-cyclopentadienyl})(\eta6\text{-xylene})Fe^+$, $(\eta5\text{-cyclopentadienyl})(\eta6\text{-1-methylnaphthalene})Fe^+$, $(\eta5\text{-cyclopentadienyl})(\eta6\text{-cumene})Fe^+$, $(\eta5\text{-cyclopentadienyl})(\eta6\text{-mesitylene})Fe^+$, $(\eta5\text{-cyclopentadienyl})(\eta6\text{-pyrene})Fe^+$, $(\eta5\text{-fluorenyl})(\eta6\text{-cumene})Fe^+$, $(\eta5\text{-indenyl})(\eta6\text{-cumene})Fe^+$, $bis(\eta6\text{-mesitylene})Fe^{2+}$, $bis(\eta6\text{-xylene})Fe^{2+}$, $bis(\eta6\text{-cumene})Fe^{2+}$, $bis(\eta6\text{-toluene})Fe^{2+}$, $(\eta6\text{-toluene})(\eta6\text{-xylene})Fe^{2+}$, $(\eta6\text{-cumene})(\eta6\text{-naphthalene})Fe^{2+}$, $bis(\eta5\text{-cyclopentadienyl})Fe^{2+}$, $bis(\eta5\text{-indenyl})Fe^+$, $(\eta5\text{-cyclopentadienyl})(\eta5\text{-fluorenyl})Fe^+$ and $(\eta5\text{-cyclopentadienyl})(\eta5\text{-indenyl})Fe^+$.

(Counter Anion)

The counter anions used in the present invention will be explained.

The anion may be any conventionally known anion, and examples thereof include halogen ions such as $F^-$, $Cl^-$, $Br^-$, and $I^-$; $OH^-$; $ClO^-$; sulfonic acid ions such as $FSO_3^-$, $ClSO_3^-$, $CH_3SO_3^-$, $C_6H_5SO_3^-$, and $CF_3SO_3^-$; sulfuric acid ions such as $HSO_4^-$ and $SO_4^{2-}$; carboxylic acid ions such as $HCO_3^-$ and $CO_3^{2-}$; phosphoric acid ions such as $H_2PO_4^-$, $HPO_4^{2-}$, and $PO_4^{3-}$; fluorophosphoric acid ions such as $PF_6^-$ and $PF_5OH^-$; fluorinated alkylfluorophosphoric acid ions such as $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$ and $[((CF_3)_2CFCF_2)_2PF_4]^-$; boric acid ions such as $BF_4^-$, $B(C_6F_5)_4^-$, and $B(C_6H_4CF_3)_4^-$; $AlCl_4^-$; fluoroantimonic acid ions such as $BiF_6^-$, $SbF_6^-$, and $SbF_5OH^-$; and fluoroarsenic acid ions such as $AsF_6^-$ and $AsF_5OH^-$.

There are no particular limitations on the counter anion used in the present invention; however, from the viewpoint of lengthening of the service life of the organic electronic elements and from the viewpoint that when the counter anion is combined with the anions described above, the combinations form polymerization initiators capable of curing at a low temperature, the following structures are preferred.

Fluorophosphoric acid ions such as $PF_6^-$, $PF_5OH^-$; fluorinated alkylfluorophosphoric acid ions such as $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, and $[((CF_3)_2CFCF_2)_2PF_4]^-$; boric acid ions such as $BF_4^-$, $B(C_6F_5)_4^-$, and $B(C_6H_4CF_3)_4^-$; $AlCl_4^-$; and fluoroantimonic acid ions such as $BiF_6^-$, $SbF_6^-$, and $SbF_5OH^-$ are preferred.

In regard to the ionic compound according to the present invention, there are no particular limitations on the combination of the counter cation and the counter anion. However, as an initiator which works as an electron-accepting compound capable of one-electron oxidation of a hole transporting compound, and which is capable of curing at a low temperature when combined with the anions described above in order to decrease the driving voltage of organic EL elements and to lengthen the service life of organic electronic elements, combinations of carbonium cations and fluorophosphoric acid ions such as $PF_6^-$ and $PF_5OH^-$; boric acid ions such as $BF_4^-$, $B(C_6F_5)_4^-$, and $B(C_6H_4CF_3)_4^-$; or fluoroantimonic acid ions such as $SbF_6^-$ and $SbF_5OH^-$; and combinations of aniliniums and fluorophosphoric acid ions such as $PF_6^-$, $PF_5OH^-$; boric acid ions such as $BF_4^-$, $B(C_6F_5)_4^-$, and $B(C_6H_4CF_3)_4^-$; or fluoroantimonic acid ions such as $SbF_6^-$ and $SbF_5OH^-$ are preferred. Combinations of carbonium cations and boric acid ions such as $B(C_6F_5)_4^-$ and $B(C_6H_4CF_3)_4^-$; or fluoroantimonic acid ions such as $SbF_6^-$ and $SbF_5OH^-$; and combinations of aniliniums and boric acid ions such as $B(C_6F_5)_4^-$ and $B(C_6H_4CF_3)_4^-$; or fluoroantimonic acid ions such as $SbF_6^-$ and $SbF_5OH^-$ are more preferred.

Specific examples include a salt of triphenylcarbonium cation and $SbF_6^-$, a salt of triphenylcarbonium cation and $B(C_6F_5)_4^-$, a salt of N,N-dimethylanilinium and $SbF_6^-$, and a salt of N,N-dimethylanilinium and $B(C_6F_5)_4^-$.

The ionic compound may be used singly, or two or more kinds may be used as a mixture at any ratio.

[Charge Transporting Compound]

According to the present invention, the charge transporting compound is a compound having a charge transporting unit.

The "charge transporting unit" means an atomic group having an ability to transport holes or electrons, and the details thereof will be described below.

The charge transporting unit is not particularly limited as long as it has an ability to transport holes or electrons; however, the charge transporting unit is preferably an amine having an aromatic ring, a carbazole or a thiophene, and is preferably a moiety having a partial structure represented by, for example, the following formulas (1a) to (7a).

[Chemical Formula 2]

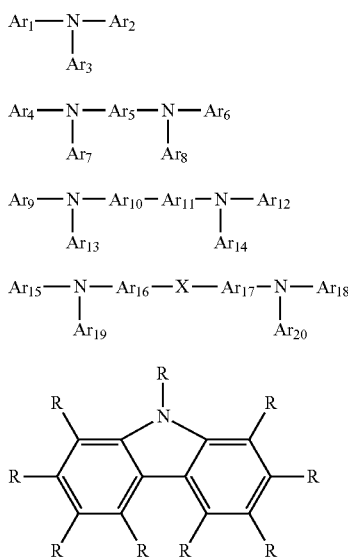

wherein $Ar_1$ to $Ar_{20}$ each independently represent an aryl group or heteroaryl group having 2 to 30 carbon atoms, or a substituted or unsubstituted arylene group or heteroarylene group. Here, the aryl group means an atomic group obtained by excluding one hydrogen atom from an aromatic hydrocarbon, and the heteroaryl group means an atomic group obtained by excluding one hydrogen atom from an aromatic compound having a heteroatom, or represents R. R's each independently represent —$R^1$, —$OR^2$, —$SR^3$, —$OCOR^4$, —$COOR^5$, —$SiR^6R^7R^8$, or one of formulas (2a) to (4a) (wherein $R^1$ to $R^8$ each represent a hydrogen atom, a linear, cyclic or branched alkyl group having 1 to 22 carbon atoms, or an aryl group or heteroaryl group having 2 to 30 carbon atoms). Here, the arylene group means an atomic group obtained by excluding two hydrogen atoms from an aromatic hydrocarbon, and the heteroarylene group means an atomic group obtained by excluding two hydrogen atoms from an aromatic compound having a heteroatom. X represents a group obtained by further removing one hydrogen atom from a group having one or more hydrogen atoms among the groups of R.

Furthermore, in the present invention, the charge transporting compound is preferably a polymer or an oligomer, from the viewpoints of solubility and film formability. It is also preferable that the polymer or oligomer contain a repeating unit represented by one of the following formulas.

[Chemical Formula 3]

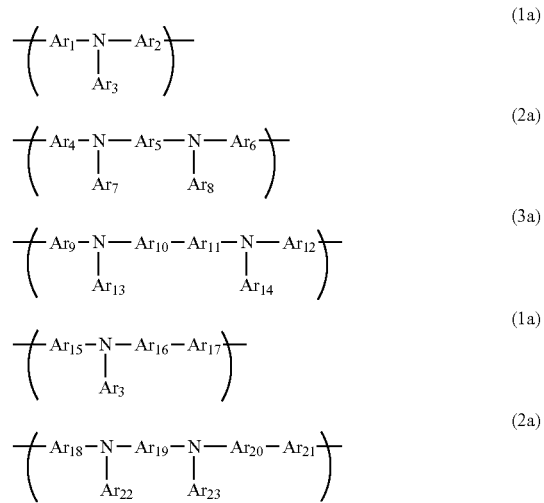

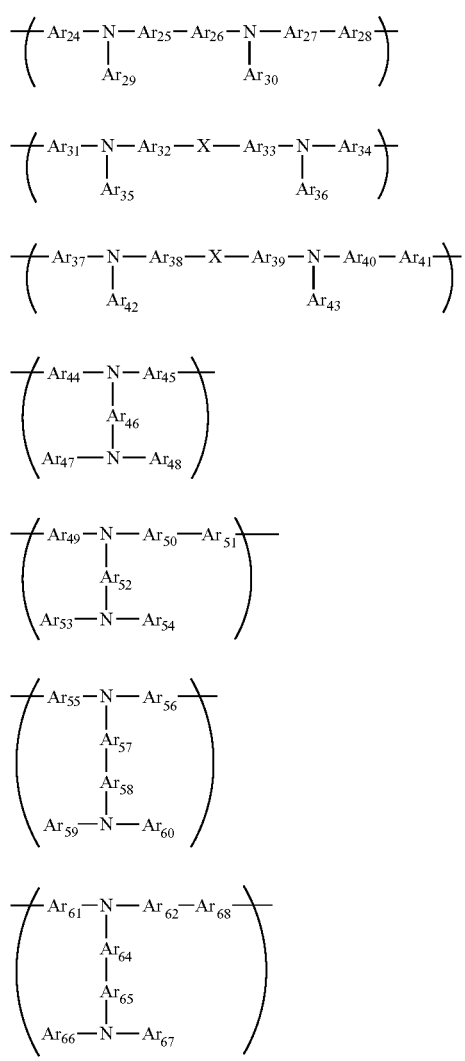
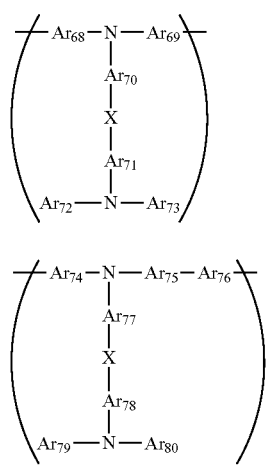
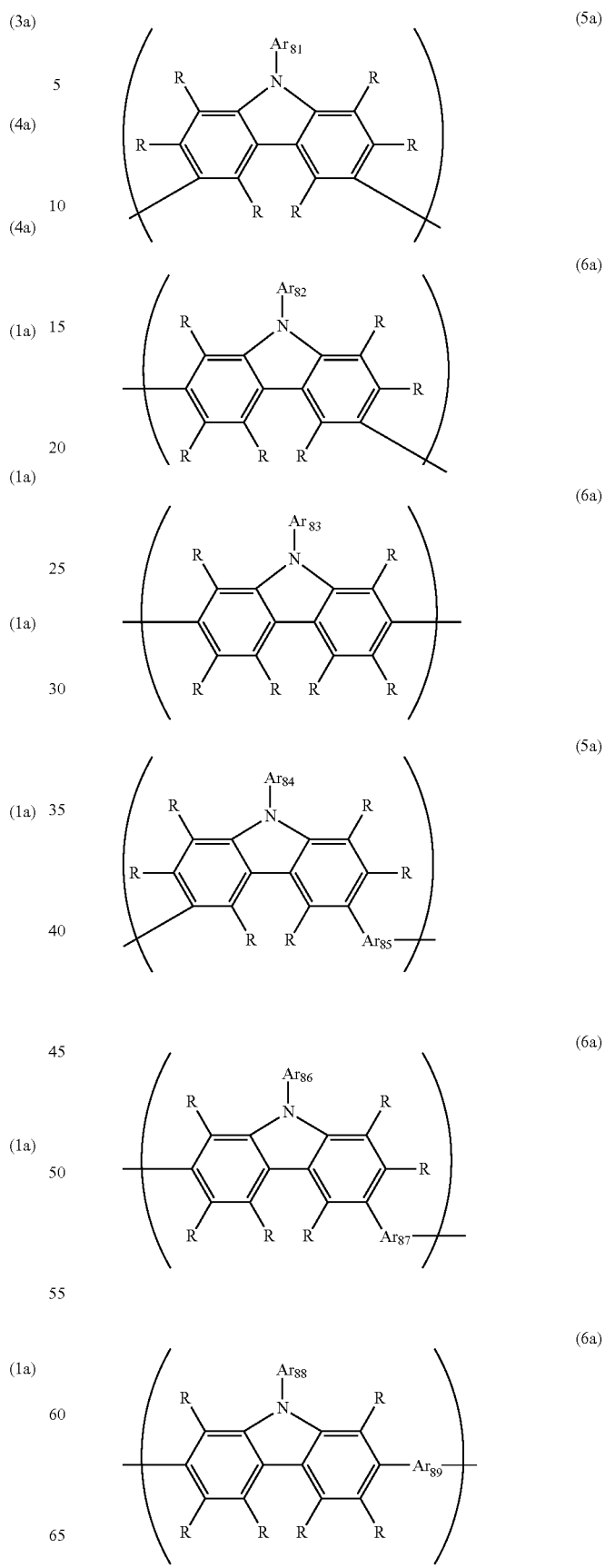

-continued
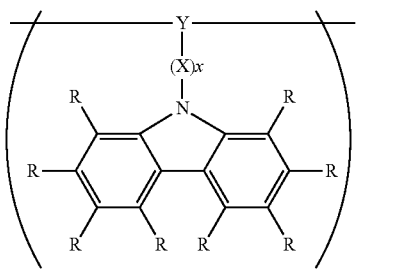
(5a)
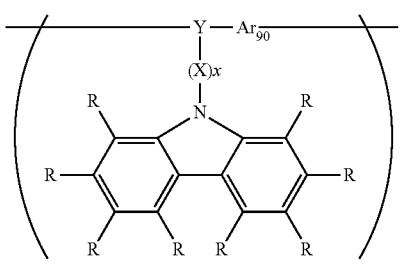
(5a)
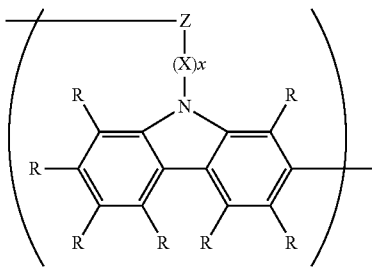
(5a)
[Chemical Formula 5]
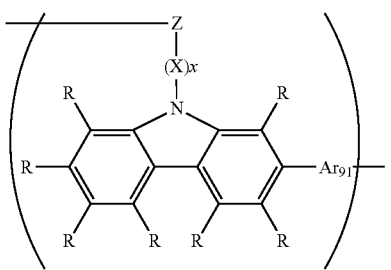
(5a)
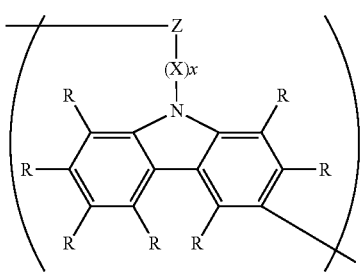
(5a)
-continued
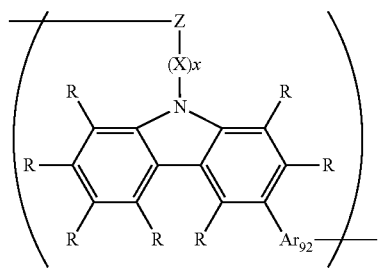
(5a)
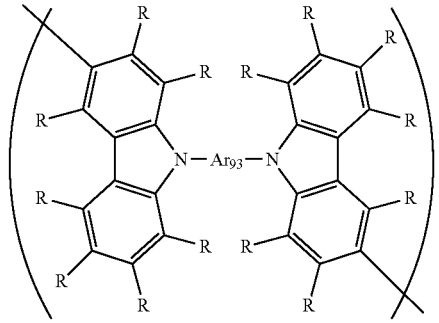
(5a)
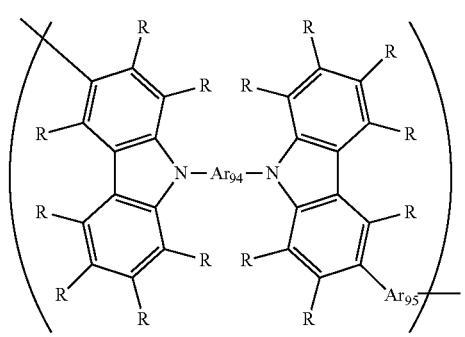
(5a)
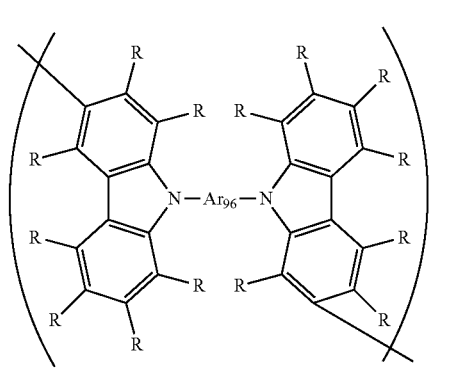
(5a)
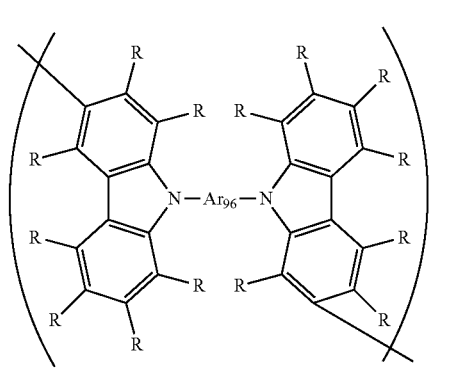
(5a)
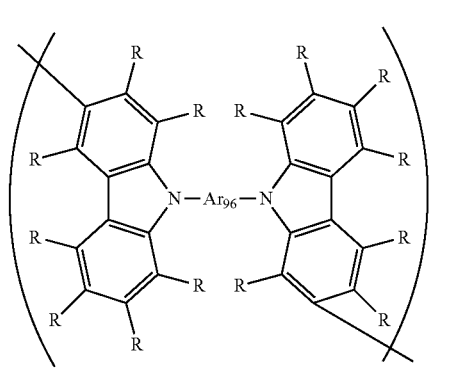
(5a)

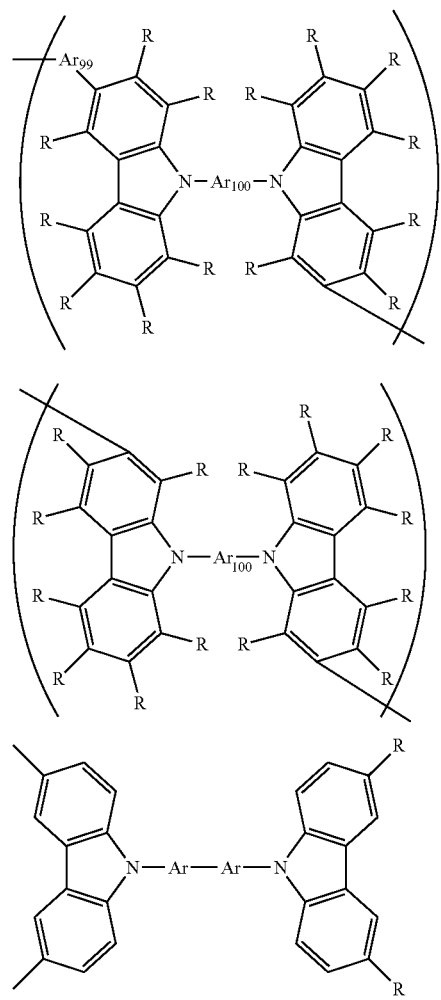
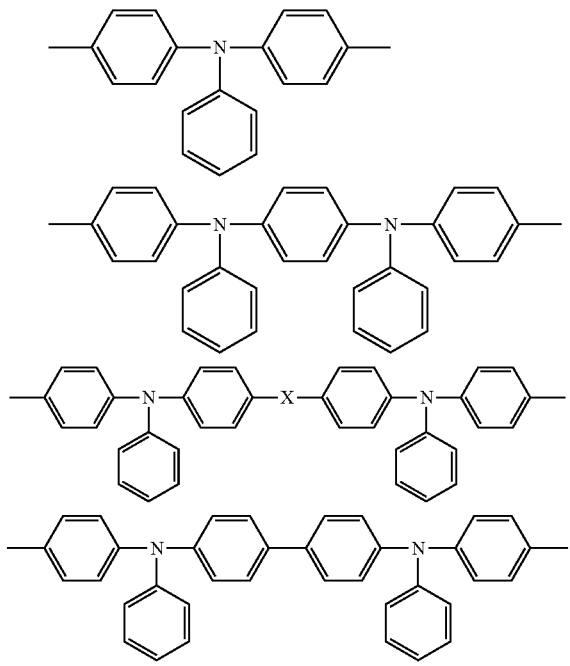
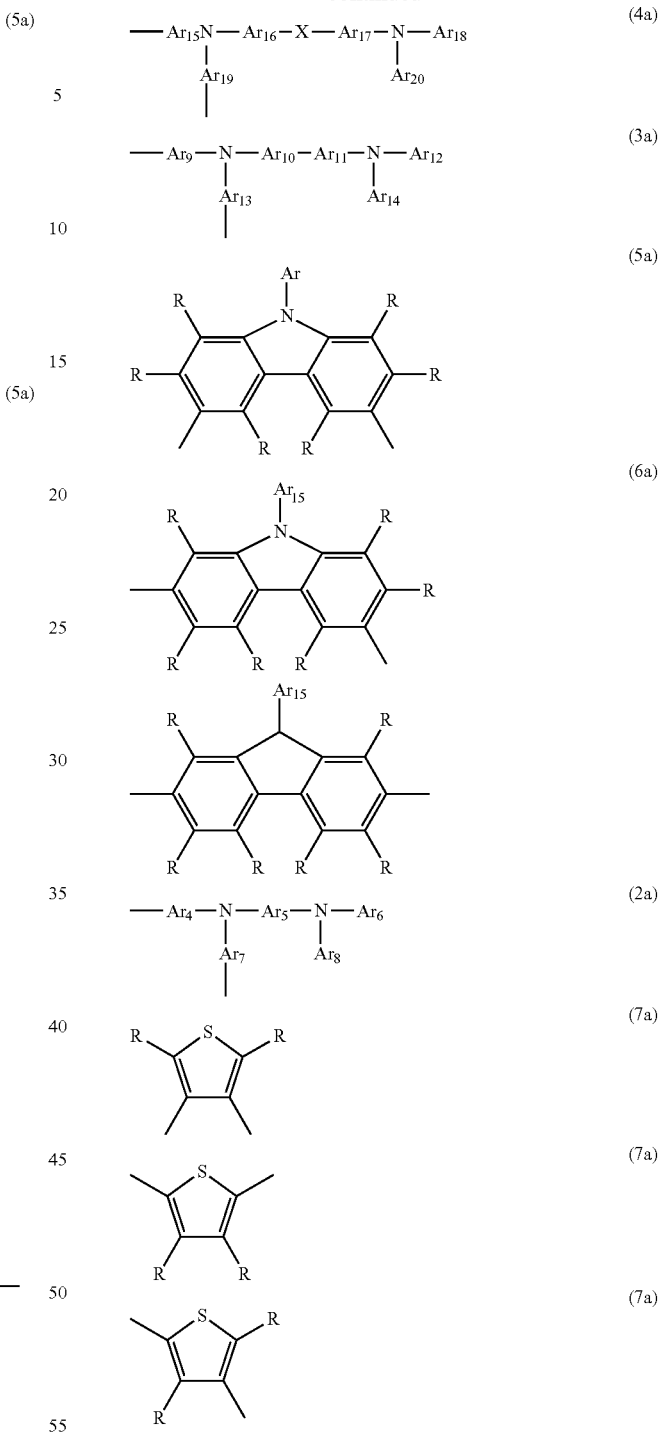

In the formulas described above, $Ar_1$ to $Ar_{100}$ each independently represent an aryl group or heteroaryl group having 2 to 30 carbon atoms, or a substituted or unsubstituted arylene group or heteroarylene group. Here, the aryl group means an atomic group obtained by excluding one hydrogen atom from an aromatic hydrocarbon, and the heteroaryl group means an atomic group obtained by excluding one hydrogen atom from an aromatic compound having a heteroatom, or represents R. R's each independently represent $-R^1$, $-OR^2$, $-SR^3$, $-OCOR^4$, $-COOR^5$, $-SiR^6R^7R^8$, or one of the formulas (2a) to (4a) (wherein $R^1$ to $R^8$ each independently represent a hydrogen atom, a linear, cyclic or branched alkyl group having 1 to 22 carbon atoms, or an aryl group or heteroaryl group having 2 to 30 carbon atoms). Here, the arylene group means an atomic group obtained by excluding two hydrogen atoms from an aromatic hydrocarbon, and the heteroarylene group means an atomic group obtained by excluding two hydrogen atoms from an aromatic compound having a heteroatom. X represents a group obtained by further removing one hydrogen atom from a group having one or more hydrogen atoms among the groups of R. Y represents a trivalent substituent, and Z represents a divalent substituent. Further, x represents an integer of 1 or greater.

Furthermore, the polymer or oligomer preferably has at least one "polymerizable substituent" in order to change the solubility. Here, the "polymerizable substituent" means a substituent capable of forming an intermolecular bond between two or more molecules through a polymerization reaction, and the details thereof will be described below.

Examples of the polymerizable substituent include a group having carbon-carbon multiple bond (examples include a vinyl group, an acetylene group, a butenyl group, an acrylic group, an acrylate group, an acrylamide group, a methacrylic group, a methacrylate group, a methacrylamide group, an arene group, an allyl group, a vinyl ether group, a vinylamino group, a furyl group, a pyrrole group, a thiophene group, a silole group, and the like), a group having a small-membered ring (examples include a cyclopropyl group, a cyclobutyl group, an epoxy group, an oxetane group, a diketene group, an episulfide group, and the like), a lactone group, a lactam group, a group containing a siloxane derivative, and the like. In addition to the groups described above, a combination of groups capable of forming an ester bond or an amide bond, and the like may also used. Examples thereof include a combination of an ester group and an amino group, a combination of an ester group and a hydroxyl group, and the like. As the polymerizable substituent, particularly, an oxetane group, an epoxy group, a vinyl group, a vinyl ether group, an acrylate group, and a methacrylate group are preferred from the viewpoint of reactivity, and an oxetane group is particularly preferred.

Furthermore, the polymer or oligomer that forms the polymerized layer according to the present invention may also a copolymer having the arylene group, a heteroarylene group or the structures represented by the formulas shown above as copolymerization repeating units, in addition to the repeating units described above, from the viewpoint of adjusting the solubility, heat resistance, or electrical characteristics. In this case, the copolymer may be a random, block or graft copolymer, and may also be a polymer having an intermediate structure thereof, for example, a random copolymer having the characteristics of a block copolymer. In addition, the polymer or oligomer used in the present invention may have branches in the main chain, so that the polymer or oligomer may have three or more chain ends.

(Solvent)

Examples of the solvent used in the present invention include chloroform, methylene chloride, dichloroethane, tetrahydrofuran, toluene, xylene, mesitylene, anisole, phenethol, acetone, methyl ethyl ketone, ethyl acetate, butyl acetate, ethyl acetate, n-butyl acetate, ethyl lactate, n-butyl lactate, γ-butyrolactone, ethyl cellosolve acetate, phenyl acetate, phenyl propionate, methyl benzoate, ethyl benzoate, propyl benzoate, n-butyldiphenylmethane benzoate, diphenyl ether, N,N-dimethylformamide, N,N-dimethylacetamide, ethylene glycol dimethyltetraline, and the like. Any of these may be used singly, or any two or more kinds may be used in combination at any ratio.

(Ratio)

The ratio of the ionic compound is preferably from 0.01 parts by mass to 50 parts by mass, more preferably from 0.05 parts by mass to 25 parts by mass, and particularly preferably from 0.1 parts by mass to 20 parts by mass, relative to 100 parts by mass of the charge transporting compound. If the incorporation ratio of the ionic compound is less than 0.01 parts by mass, the effect of decreasing the driving voltage may not be obtained, and if the incorporation ratio exceeds 50 parts by mass, the driving voltage tends to increase.

When the ionic compound is used as a polymerization initiator, the ratio of the ionic compound is preferably from 0.1 parts by mass to 50 parts by mass relative to 100 parts by mass of the compound having a polymerizable substituent. If the ratio is less than 0.1 parts by mass, polymerization does not proceed sufficiently. If the ratio exceeds 50 parts by mass, there is a problem that the film quality deteriorates. Meanwhile, in the polymerization method using the ionic compound as a polymerization initiator, it is preferable to initiate polymerization only by heating.

(Other Components)

The ionic compound combines the functions of a polymerization initiator and an electron acceptor. These may be used singly or in combination of plural compounds. The material for organic electronics may also contain a polymerization initiator or an electron acceptor, which is out of the scope of the present invention. Furthermore, the material may also contain a crosslinking material or a light emitting material as necessary.

<Organic Electroluminescent Element>

The organic electroluminescent element (hereinafter, referred to as "organic EL element") of the present invention is provided in a first embodiment and a second embodiment, and first, the first embodiment will be explained.

[Organic EL Element of First Embodiment]

The organic EL element of the first embodiment of the present invention is characterized by having a layer formed from the material for organic electronics of the present invention as described above (hereinafter, also referred to as a polymerized layer). The organic EL element of the present invention is not particularly limited as long as it includes a light emitting layer, a polymerized layer, an anode, a cathode, and a substrate, and the organic EL element may also have other layers such as a hole injection layer, an electron injection layer, a hole transport layer, and an electron transport layer. The various layers will be explained in detail below.

[Light Emitting Layer]

The material used in the light emitting layer may be a low molecular weight compound, or may be a polymer or an oligomer, and a dendrimer or the like can also be used. Examples of a low molecular weight compound using fluorescent light emission include perylene, coumarin, rubrene, quinacridone, a dye for dye laser (for example, rhodamine, DCM1, and the like), an aluminum complex (for example, Tris(8-hydroxyquinolinato)aluminum(III) ($Alq_3$), stilbene, and derivatives thereof. As a polymer or an oligomer using fluorescent light emission, polyfluorene, polyphenylene, polyphenylenevinylene (PPV), polyvinylcarbazole (PVK), a fluorene-benzothiadiazole copolymer, a fluorene-triphenylamine copolymer, and derivatives or mixtures thereof can be suitably used.

On the other hand, for the purpose of a recent increase in the efficiency of organic EL elements, the development of phosphorescent organic EL elements is also actively carried out. In a phosphorescent organic EL element, it is possible to utilize not only the singlet state energy but also the triplet state energy, and the internal quantum yield can be increased up to 100% in principle. In a phosphorescent organic EL element, phosphorescent light emission is extracted by doping into a host material a metal complex-based phosphorescent material containing a heavy metal such as platinum or iridium as a dopant emitting phosphorescent light (see Non-Patent Documents 3 to 5).

Further for the organic EL element of the present invention, from the viewpoint of increasing the efficiency, it is preferable to use a phosphorescent material in the light emitting layer. As the phosphorescent material, a metal complex containing a core metal such as Ir or Pt, and the like can be suitably used. Specifically, examples of an Ir complex include FIr(pic) [iridium(III) bis[(4,6-difluorophenyl)-pyridinato-N,$C^2$]picolinate] emitting blue light; Ir(ppy)$_3$ [fac-tris(2-phenylpyridine)iridium] emitting green light (see Non-Patent Document 4); (btp)$_2$Ir(acac) {bis[2-(2'-benzo[4, 5-α]thienyl)-pyridinato-N,C3]iridium (acetylacetonate)}, and Ir(piq)$_3$ [tris(1-phenylisoquinoline)iridium] emitting red light, as disclosed in Adachi et al., Appl. Phys. Lett., 78, No. 11, 2001, 1622; or the like.

Examples of a Pt complex include 2,3,7,8,12,13,17,18-octaethyl-21H,23H-porphine platinum (PtOEP) which emits red light; and the like.

As for the phosphorescent material, a low molecular weight compound or dendride compound, for example, an iridium core dendrimer can be used. Derivatives thereof can also be suitably used.

Furthermore, when a phosphorescent material is contained in the light emitting layer, it is preferable that the light emitting layer contain a host material in addition to the phosphorescent material.

The host material may be a low molecular weight compound, or may be a high molecular weight compound, and dendrimers and the like can also be used.

Examples of the low molecular weight compound that can be used include CBP (4,4'-bis(carbazol-9-yl)-biphenyl), mCP (1,3-bis(9-carbazolyl)benzene), CDBP (4,4'-bis(carbazol-9-yl)-2,2'-dimethylbiphenyl), and the like; and examples of the high molecular weight compound that can be used include polyvinylcarbazole, polyphenylene, polyfluorene, and the like. Derivatives thereof can also be used.

The light emitting layer may be formed by a vapor deposition method, or may be formed by a coating method.

When the light emitting layer is formed by a coating method, the organic EL elements can be produced at low cost, and it is preferable. In order to form a light emitting layer according to a coating method, a solution containing a phosphorescent material and optionally a host material can be applied on a desired substrate by a known method such as, for example, an ink-jet method, a casting method, an immersion method, a printing method such as relief printing, intaglio printing, offset printing, lithographic printing, reverse relief offset printing, screen printing or gravure printing, or a spin coating method.

The coating method such as described above can be carried out usually at a temperature in the range of −20° C. to +300° C., preferably 10° C. to 100° C., and particularly preferably 15° C. to 50° C. Furthermore, there are no particular limitations on the solvent used in the solution, but examples of the solvent include chloroform, methylene chloride, dichloroethane, tetrahydrofuran, toluene, xylene, mesitylene, anisole, acetone, methyl ethyl ketone, ethyl acetate, butyl acetate, ethyl cellosolve acetate, diphenylmethane, diphenyl ether, tetraline, and the like.

Further, after coating, the solvent may be removed by heating the solution on a hot plate or in an oven at a temperature in the range of +30° C. to +300° C.

[Polymerized Layer]

The polymerized layer is a layer formed by coating the material for organic electronics of the present invention described above on a substrate. According to the present invention, the charge transporting compound in the material for organic electronics is preferably a charge transporting compound having one or more polymerizable substituent, and a polymerized layer formed by using a material for organic electronics containing such a charge transporting compound will be explained in detail here.

The polymerized layer is specifically a layer obtained by applying a material for organic electronics containing a charge transporting compound having one or more polymerizable substituents, on a desired substrate by a coating method that will be described later with regard to the method for forming a thin film, subsequently carrying out a polymerization reaction of the polymerizable substituent carried by the charge transporting compound by light irradiation or a heating treatment, and thereby modifying the solubility of the coating layer (curing).

As described above, when a polymerization reaction of the polymerizable substituent carried by the charge transporting compound is carried out, and thereby the solubility of the coating layer is modified (cured), the thermal stability of the layer can be improved.

Furthermore, as the solubility is decreased by a polymerization reaction, even in the case of further coating and forming another layer such as a light emitting layer, the polymerized layer is not dissolved by the coating liquid. Therefore, the relevant other layer can be formed by a coating method. That is, a multilayer structure can be easily produced according to a coating method, and an organic EL element having high efficiency and a long service life can be produced at low cost. The charge transporting compound used in the polymerized layer is preferably a polymer or oligomer containing a repeating unit having hole transportability, from the viewpoint of the uniformity of the film.

The polymerized layer can be made into a hole injection layer, a hole transport layer, an electron transport layer, or an electron injection layer of an organic EL element, and from the viewpoints of the light emission efficiency and lifetime characteristics, the polymerized layer is particularly preferably a hole injection layer or a hole transport layer.

Any one of the hole injection layer and the hole transport layer may be the polymerized layer, and it is also acceptable that both of the layers are polymerized layers. Furthermore, there are no particular limitations on the thickness of these layers, but the thickness is preferably 10 to 100 nm, more preferably 20 to 60 nm, and even more preferably 20 to 40 nm.

It is more preferable that the polymerized layer be laminated adjacently to the light emitting layer containing a phosphorescent material. It is because this polymerized layer has less effect on the light emission efficiency of the phosphorescent material and deterioration, and can improve the light emission efficiency of the element or the element lifetime.

[Substrate]

In regard to the substrate that can be used in the organic EL element of the present invention, there are no particularly limited on the type of glass, plastics and the like. Furthermore, there are no particular limitations as long as the substrate is transparent, but glass, quartz, a light transmissive resin film, and the like are used with preference. When a resin film is used, the organic EL element can be imparted with flexibility, and thus it is particularly preferable.

Examples of the resin film include films formed from polyethylene terephthalate (PET), polyethylene naphthalate (PEN), polyether sulfone (PES), polyether imide, polyether ether ketone, polyphenylene sulfide, polyallylate, polyimide, polycarbonate (PC), cellulose triacetate (TAC), cellulose acetate propionate (CAP), and the like; and the like.

Further, in the case of using a resin film, it is also desirable to use a resin film after coating the film with an inorganic substance such as silicon oxide or silicon nitride, in order to suppress the permeation of water vapor or oxygen.

[Cathode]

Preferred examples of the cathode material include metals or metal alloys such as Li, Ca, Mg, Al, In, Cs, Ba, Mg/Ag, LiF and CsF.

[Anode]

As the anode, a metal (for example, Au) or another material having metal conductivity, for example, an oxide (for example, indium oxide/tin oxide (ITO)), or an electrically conductive polymer (for example, polythiophene-polystyrene sulfonic acid mixture (PEDOT:PSS)) can also be used.

[Electron Transport Layer and Electron Injection Layer]

As the electron transport layer and the electron injection layer, for example, phenanthroline derivatives (for example, 2,9-dimethyl-4,7-diphenyl-1,10-phenanthroline (BCP)), bipyridine derivatives, nitro-substituted fluorene derivatives, diphenylquinone derivatives, thiopyrane dioxide derivatives, heterocyclic tetracarboxylic acid anhydrides of naphthalene and perylene, carbodiimides, fluorenylidenemethane derivatives, anthraquinodimethane and anthrone derivatives, oxadiazole derivatives (2-(4-biphenylyl)-5-(4-tert-butylphenyl-1,3,4-oxadiazole) (PBD)), and aluminum complexes (for example, tris(8-hydroxyquinolinato)aluminum(III) ($Alq_3$)). Furthermore, in regard to the oxadiazole derivatives, thiadiazole derivatives obtained by substituting the oxygen atom of an oxadiazole ring with a sulfur atom, and quinoxaline derivatives having a quinoxaline ring, which is known as an electron-withdrawing group, can also be used.

[Organic EL Element of Second Embodiment]

The organic EL element of the second embodiment of the present invention has a multilayer structure, and is characterized in that two adjacent layers in the multilayer structure are formed by a coating method, respectively using a mixture containing a hole transporting compound having a polymerizable substituent, and the hole transporting compounds are respectively polymerized. Hereinafter, similarly to the first embodiment, a layer which is formed by a coating method using a mixture containing a hole transporting compound having a polymerizable substituent, and has the solubility modified by polymerizing the hole transporting compound, will be referred to as a polymerized layer.

The organic electroluminescent element of the second embodiment of the present invention has a multilayer structure, but the various layers in the multilayer structure are not particularly limited as long as the multilayer structure has a light emitting layer, a polymerized layer, an anode, a cathode, and a substrate. The multilayer structure may also have other layers such as a hole injection layer, an electron injection layer, a hole transport layer, an electron transport layer, a hole blocking layer, an electron blocking layer, and an exciton blocking layer.

The various layers will be explained in detail below.

[Polymerized Layer]

The polymerized layer, that is, a layer formed by using a mixture containing a hole transport compound having a polymerized substituent, is specifically a layer obtained by applying a mixture containing a hole transporting compound having a polymerizable substituent, on a desired substrate by a coating method, subsequently carrying out a polymerization reaction of the polymerizable substituent carried by the hole transporting compound through light irradiation or a heating treatment, and thereby modifying the solubility of the coating layer (curing).

As described above, when a polymerization reaction of the polymerizable substituent carried by the hole transporting compound is carried out, and thereby the solubility of the coating layer is modified (cured), the thermal stability of the layer can be improved. Furthermore, when the solubility is decreased by the polymerization reaction, even in the case of further applying and forming another layer such as a light emitting layer, the polymerized layer is not dissolved by the coating liquid, and therefore, the other layer can be formed by a coating method. That is, a multilayer can be easily produced according to a coating method, and an organic EL element having high efficiency and a long service life can be produced at low cost. The hole transporting compound used in the polymerized layer is preferably a polymer or an oligomer, which includes a repeating unit having hole transportability, from the viewpoint of the uniformity of the film.

Furthermore, two or more kinds of hole transporting compounds having a polymerizable substituent may be used as a mixture at any ratio, or the hole transporting compounds may also be used as mixtures with hole transporting compounds that do not have a polymerizable substituent. The polymerized layer can be made into a hole injection layer, a hole transport layer, an electron transport layer or an electron injection layer of the organic EL element, and from the viewpoints of the light efficiency and lifetime characteristics, the polymerized layer is particularly preferably a hole injection layer or a hole transport layer.

Any one of the hole injection layer and the hole transport layer may be the polymerized layer, and it is also acceptable that both of the layers are polymerized layers. Furthermore, there are no particular limitations on the thickness of these layers, but the thickness is preferably 10 to 100 nm, more preferably 20 to 60 nm, and even more preferably 20 to 40 nm.

The "two adjacent layers" according to the present invention are preferably either a combination of a hole injection layer and a hole transport layer, or a combination of a hole transport layer and a light emitting layer.

Furthermore, it is contemplated that when the polymerization initiator, or an acid or the decomposition product of the polymerization initiator generated by the polymerization initiator, reacts with the compound, particularly the metal complex, in the light emitting layer of the organic EL element, the light emission efficiency or the service life decreases. For this reason, between the two adjacent layers, the polymerization initiator is incorporated only in the layer closer to the anode, and when the polymerization initiator or active ingredient diffusing from this layer causes polymerization of the other layer, a multilayer structure can be produced. On the other hand, since the light emitting layer is hardly affected by the polymerization initiator, an organic EL element having excellent light emission efficiency or service life can be produced.

Since the mixture containing a hole transporting compound having a polymerizable substituent used in the present invention may also contain a leveling agent, a defoamant, a crosslinking agent, an electron-accepting compound, a polymer having a high molecular weight atomic group which has an ability to transport holes, or the like according to necessity, in order to control the coatability of the mixture of the properties of the polymerized layer.

The "polymerizable substituent" of the hole transporting compound having a polymerizable substituent used in the present invention is a substituent capable of forming an intermolecular bond between two or more molecules by causing a polymerization reaction. The details thereof will be described below.

The polymerizable substituent is the same as the "polymerizable substituent" described in connection with the material for organic electronics of the present invention described above, and preferred examples are also the same.

The polymerizable substituent plays a role of forming an intermolecular bond between two or more molecules through the polymerization after coating, and changing the solubility of the coated film (curing). For the change of the solubility of the coated film, it is preferable that two or more polymerizable substituents be present per molecule.

The "hole transporting compound" used in the present invention means a compound containing an atomic group having an ability to transport holes, and the details thereof will be described below.

The "atomic group having an ability to transport holes" is not particularly limited as long as it has an ability to transport holes. However, the atomic group is preferably an arylamine, a carbazole or a thiophene, and for example, compounds having a partial structure represented by the following formulas (1) to (58) are preferred.

[Chemical Formula 7]

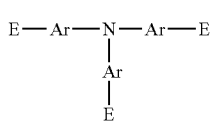 (1)

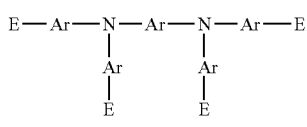 (2)

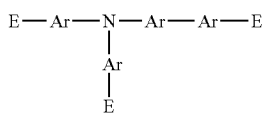 (3)

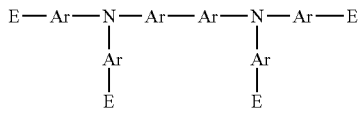 (4)

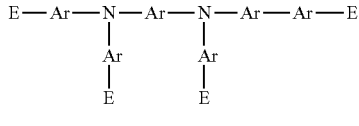 (5)

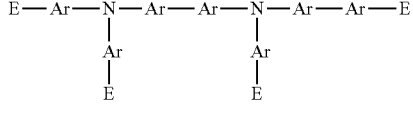 (6)

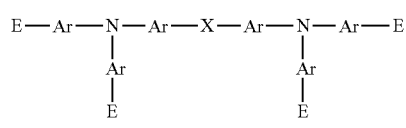 (7)

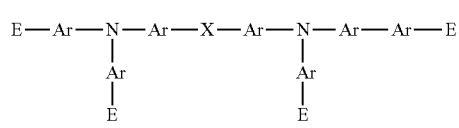 (8)

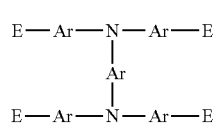 (9)

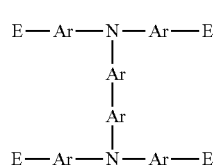 (10)

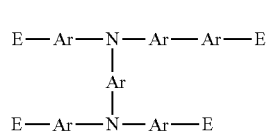 (11)

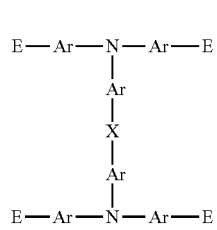 (12)

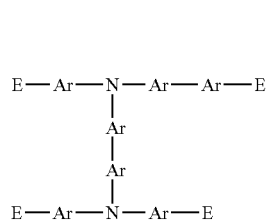 (13)

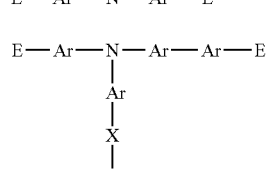 (14)

[Chemical Formula 8]

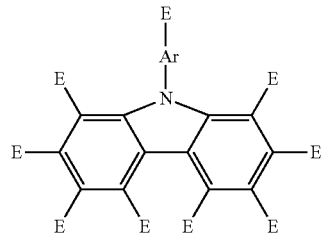 (15)

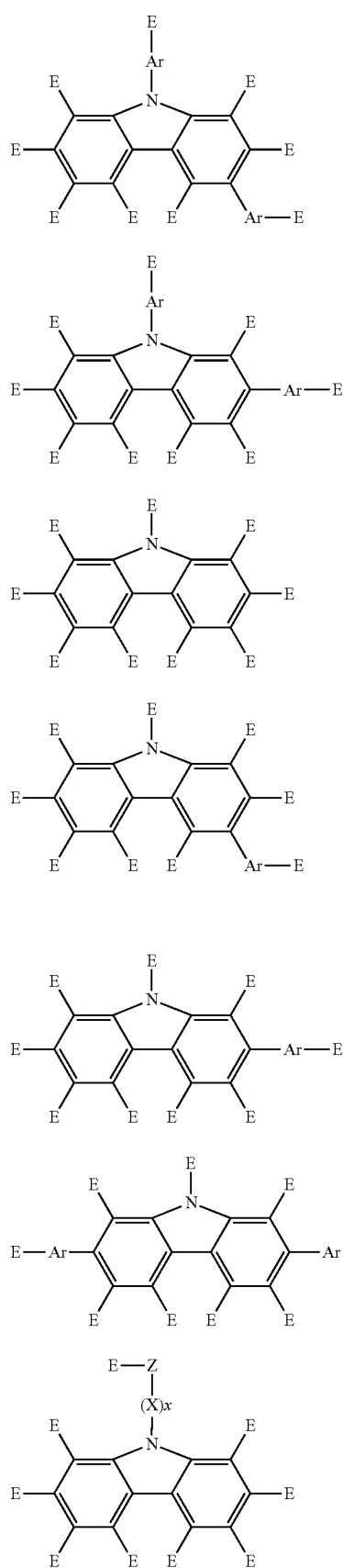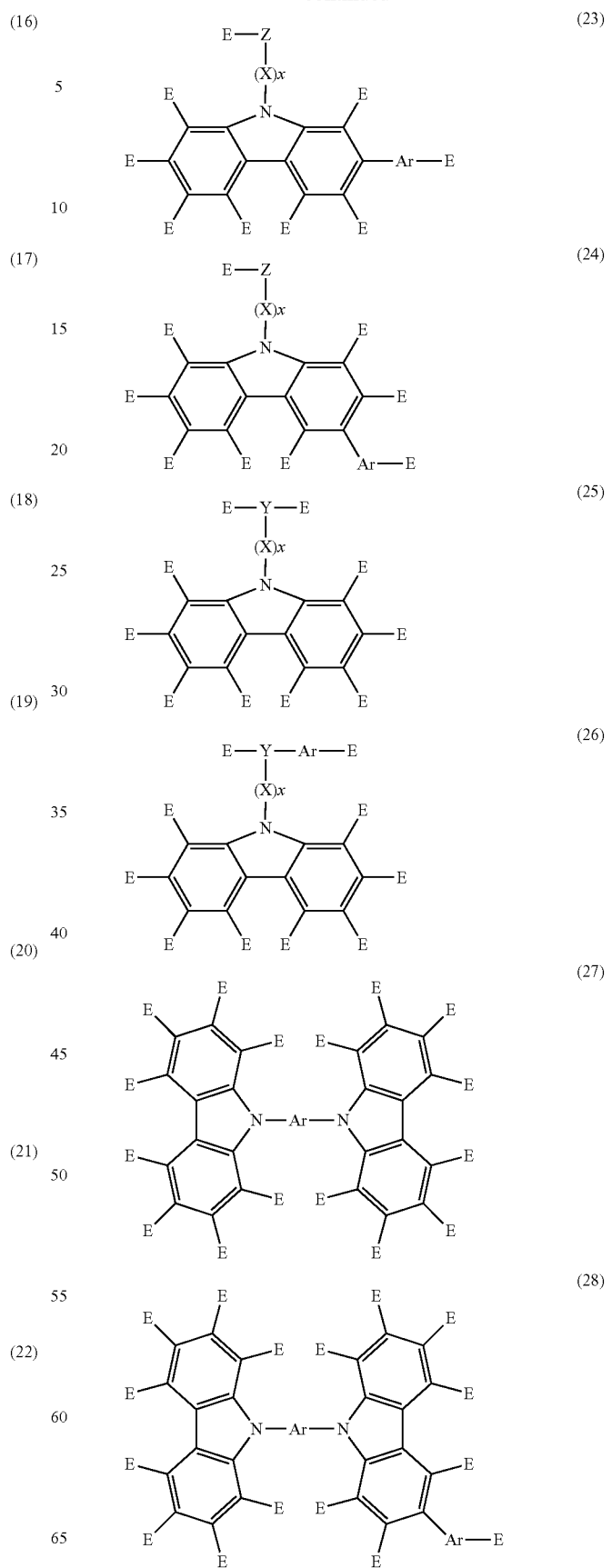

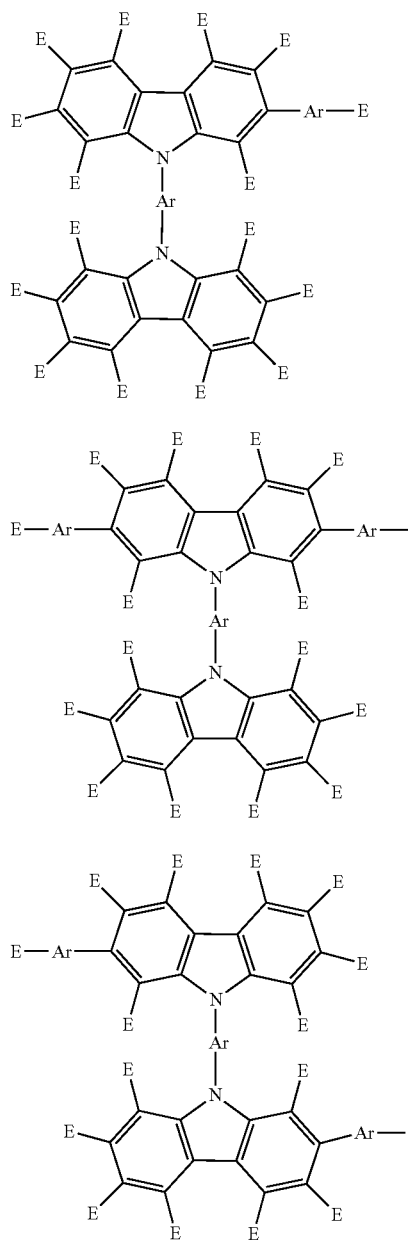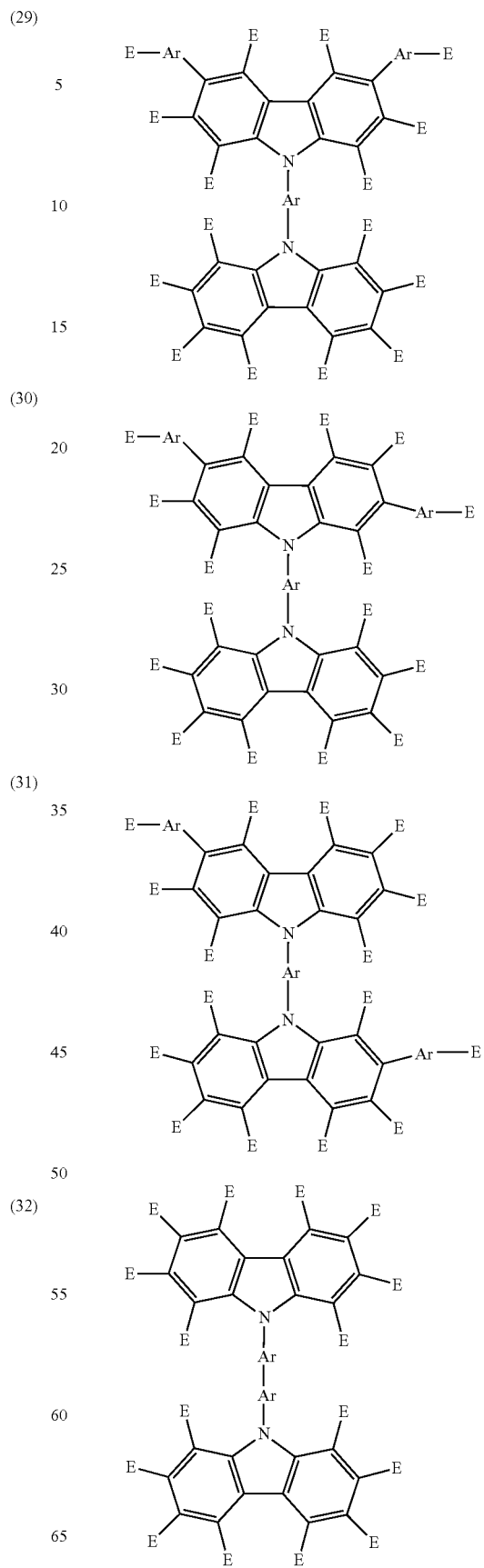

(37)
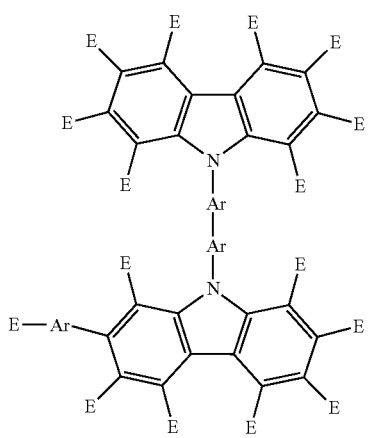
(38)
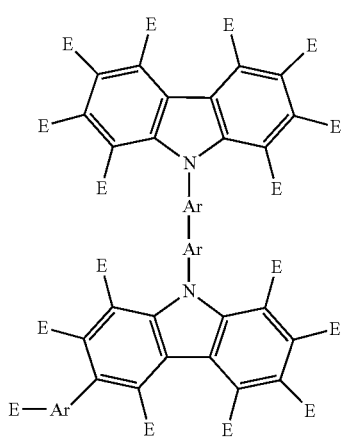
(39)
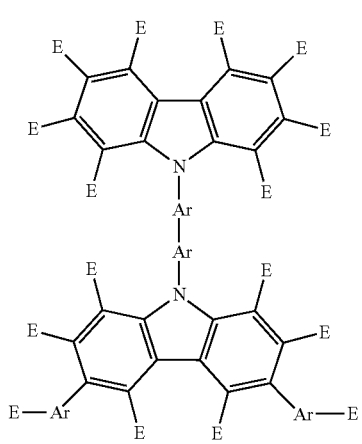
(40)
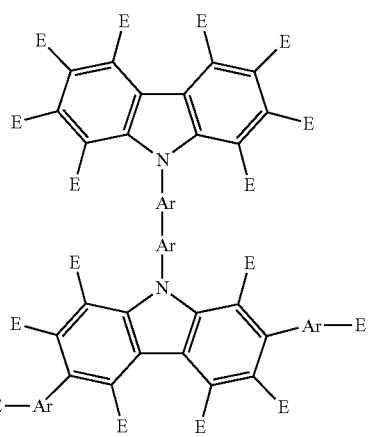
[Chemical Formula 10]
(41)
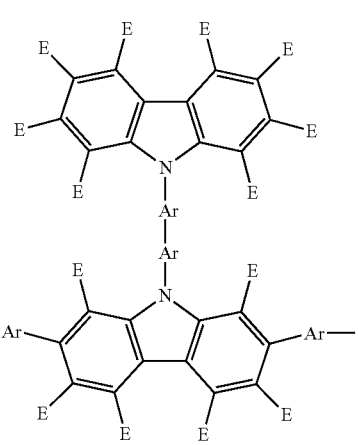
(42)
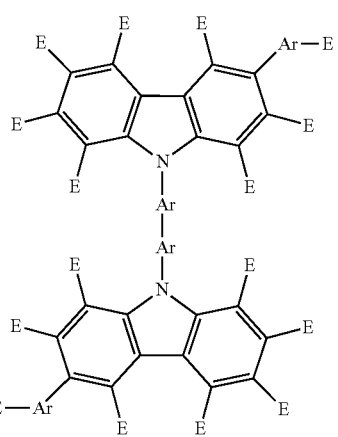

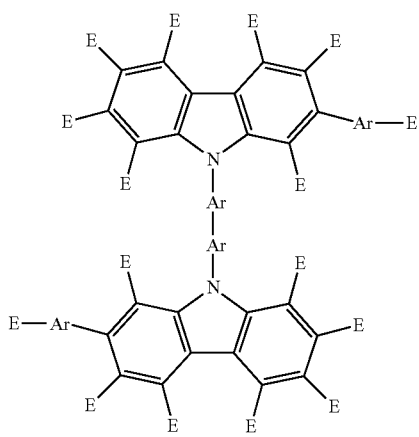
(43)
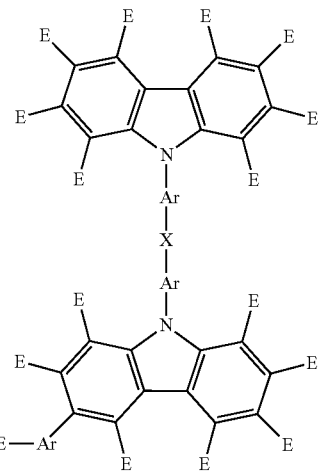
(46)
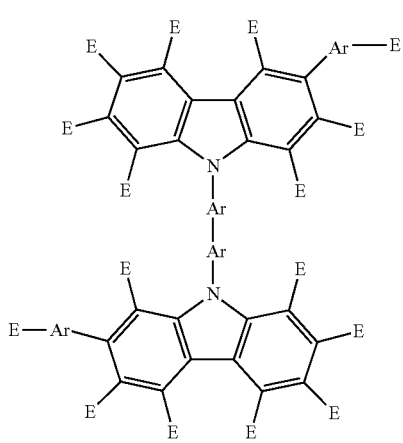
(44)
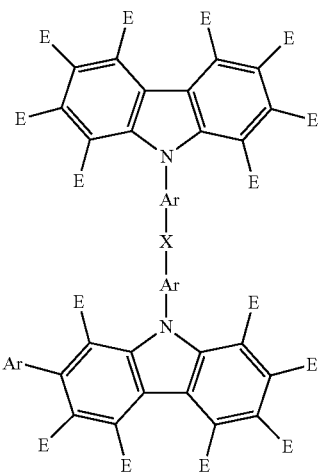
(47)
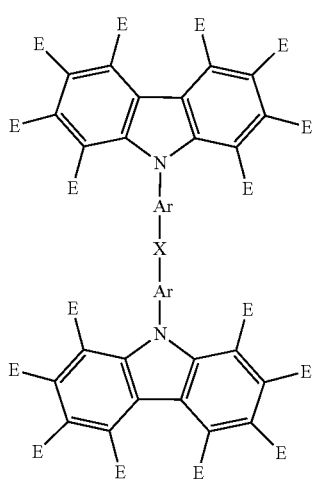
(45)
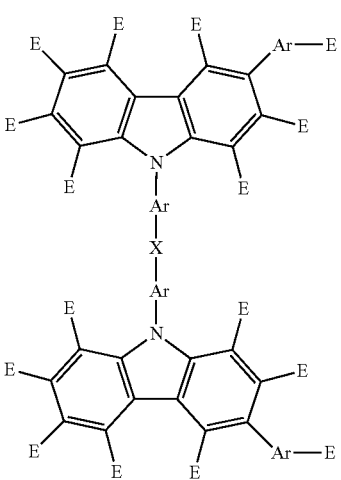
(48)

[Chemical Formula 11]
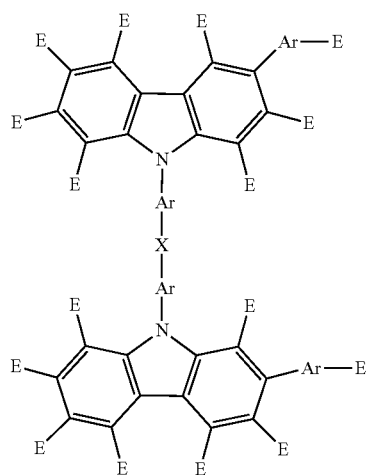
(49)
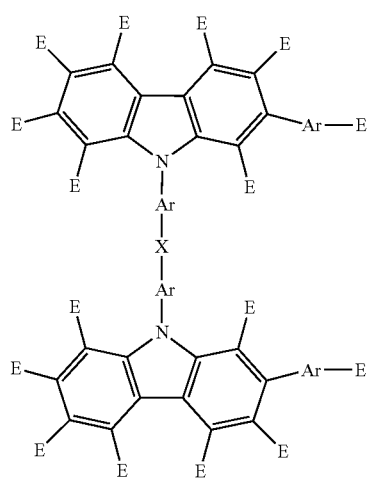
(50)
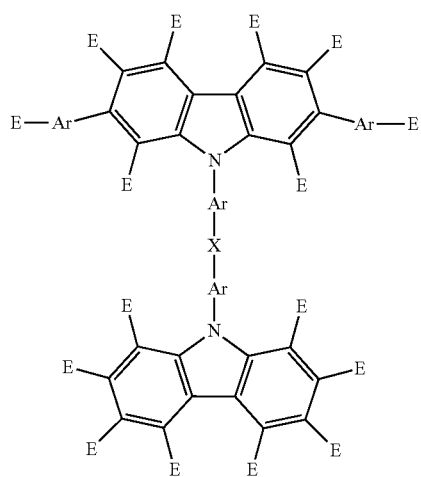
(51)
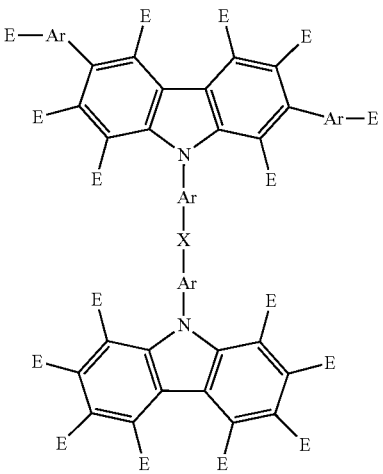
(52)
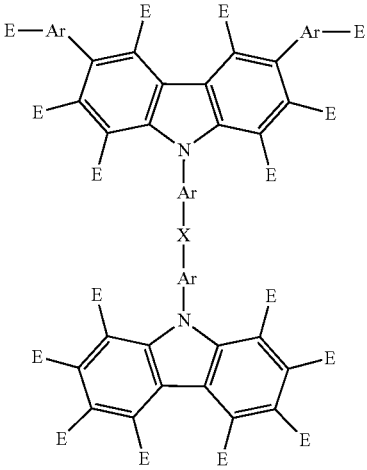
(53)
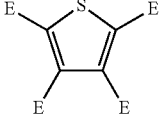
(54)
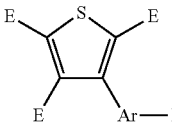
(55)
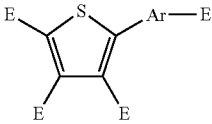
(56)
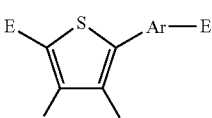
(57)
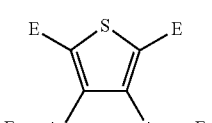
(58)

In the formulas, E's each independently represent any one of —R$^1$, —OR$^2$, —SR$^3$, —OCOR$^4$, —COOR$^5$, —SiR$^6$R$^7$R$^8$, the following formulas (59) to (61) (wherein R$^1$ to R$^{11}$ each represent a hydrogen atom, a linear, cyclic or branched alkyl group having 1 to 22 carbon atoms, or an aryl group or heteroaryl group having 2 to 30 carbon atoms; a, b and c each represent an integer of 1 or greater. Here, the aryl group means an atomic group obtained by excluding one hydrogen atom from an aromatic hydrocarbon, and may have a substituent. The heteroaryl group means an atomic group obtained by excluding one hydrogen atom from an aromatic compound having a heteroatom, and may have a substituent), and a "polymerizable substituent". Ar's each independently represent an arylene group or heteroarylene group having 2 to 30 carbon atoms. The arylene group means an atomic group obtained by excluding two hydrogen atoms from an aromatic hydrocarbon, and may also have a substituent. Examples thereof include phenylene, biphenyldiyl, terphenyldiyl, naphthalenediyl, anthracenediyl, tetracenediyl, fluorenediyl, phenanthrenediyl, and the like. The heteroaryl group means an atomic group obtained by excluding two hydrogen atoms from an aromatic compound having a heteroatom, and may also have a substituent. Examples thereof include pyridinediyl, pyrazinediyl, quinolinediyl, isoquinolinediyl, acridinediyl, phenanthrolinediyl, furandiyl, pyrrolediyl, thiophenediyl, oxazolediyl, oxadiazolediyl, thiadiazolediyl, triazolediyl, benzoxazolediyl, benzoxadiazolediyl, benzothiadiazolediyl, benzotriazolediyl, benzothiophenediyl, and the like. X and Z each independently represent a group obtained by further removing one hydrogen atom from a group having one or more hydrogen atoms among the groups of R, and X represents an integer from 0 to 2. Y represents a group obtained by removing two hydrogen atoms from a group having two or more hydrogen atoms among the groups of X or Z.

[Chemical Formula 12]

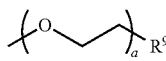
(59)

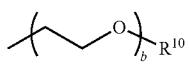
(60)

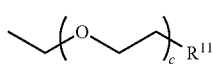
(61)

The "hole transporting compound" is more preferably an oligomer or a polymer, from the viewpoint of the uniformity of the film. The number average molecular weight of the oligomer or polymer is preferably 1,000 or more and 1,000,000 or less, more preferably 1,000 or more and 500,000 or less, and even more preferably 2,000 or more and 200,000 or less. If the number average molecular weight is less than 1,000, the polymer or oligomer is prone to crystallization, and the film-forming stability tends to decrease. If the number average molecular weight is greater than 1,000,000, the solubility in solvents decreases, and the coating workability deteriorates.

The polymer or oligomer preferably includes a repeating unit represented by the following formulas (1a) to (84a). Meanwhile, Ar, E, X and x in the formulas (1a) to (84a) have the same meanings as Ar, E, X and x in the formulas (1) to (60) described above.

[Chemical Formula 13]

(1a)

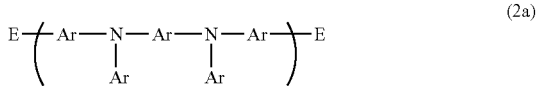
(2a)

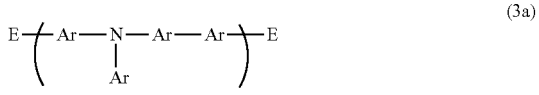
(3a)

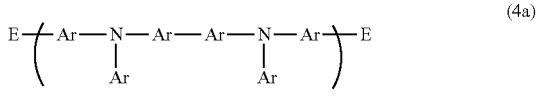
(4a)

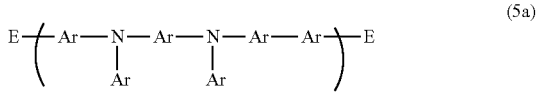
(5a)

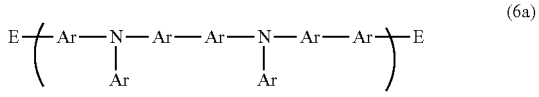
(6a)

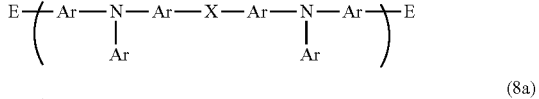
(7a)

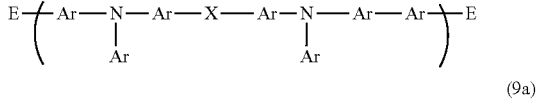
(8a)

(9a)

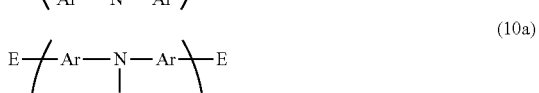
(10a)

(11a)

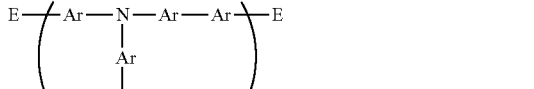
(12a)

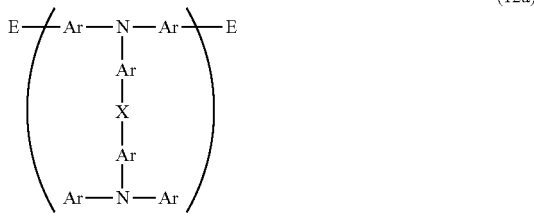

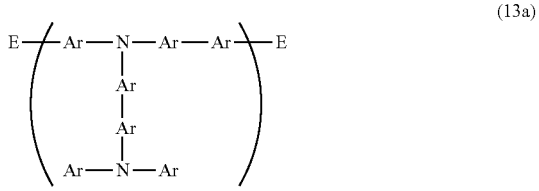
(13a)

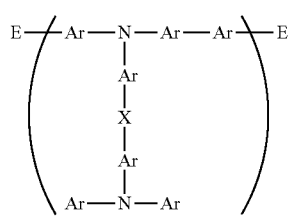
(14a)
[Chemical Formula 14]
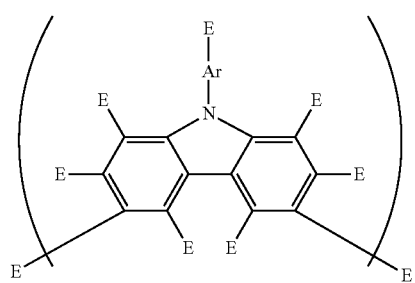
(15a)
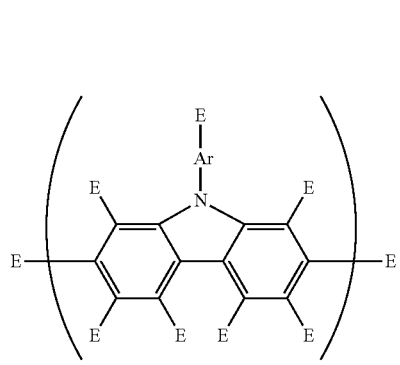
(16a)
(17a)
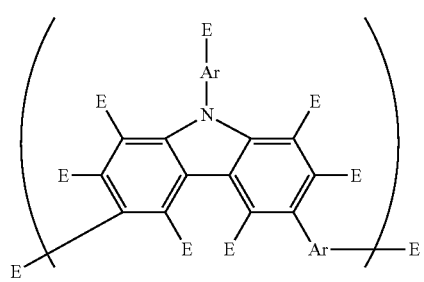
(18a)
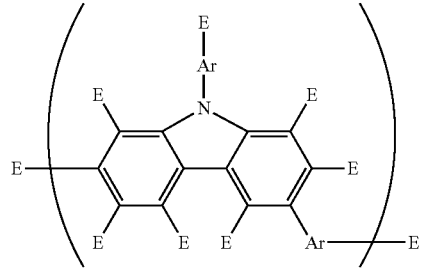
(19a)
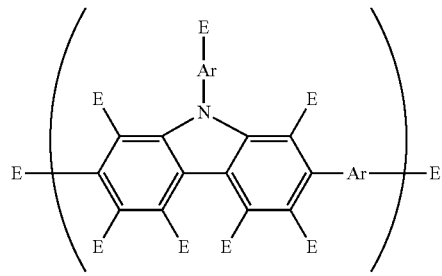
(20a)
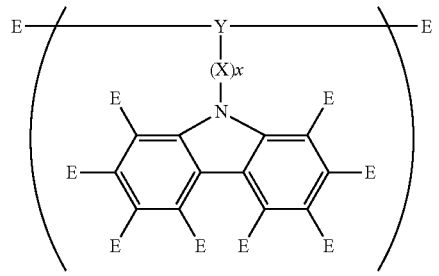
(21a)
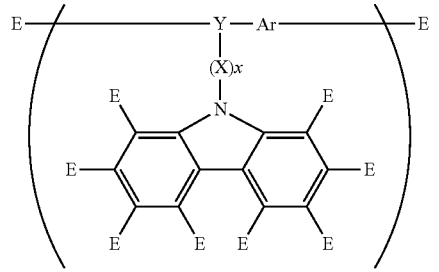
(22a)
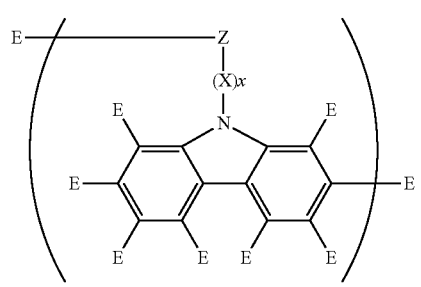
(23a)

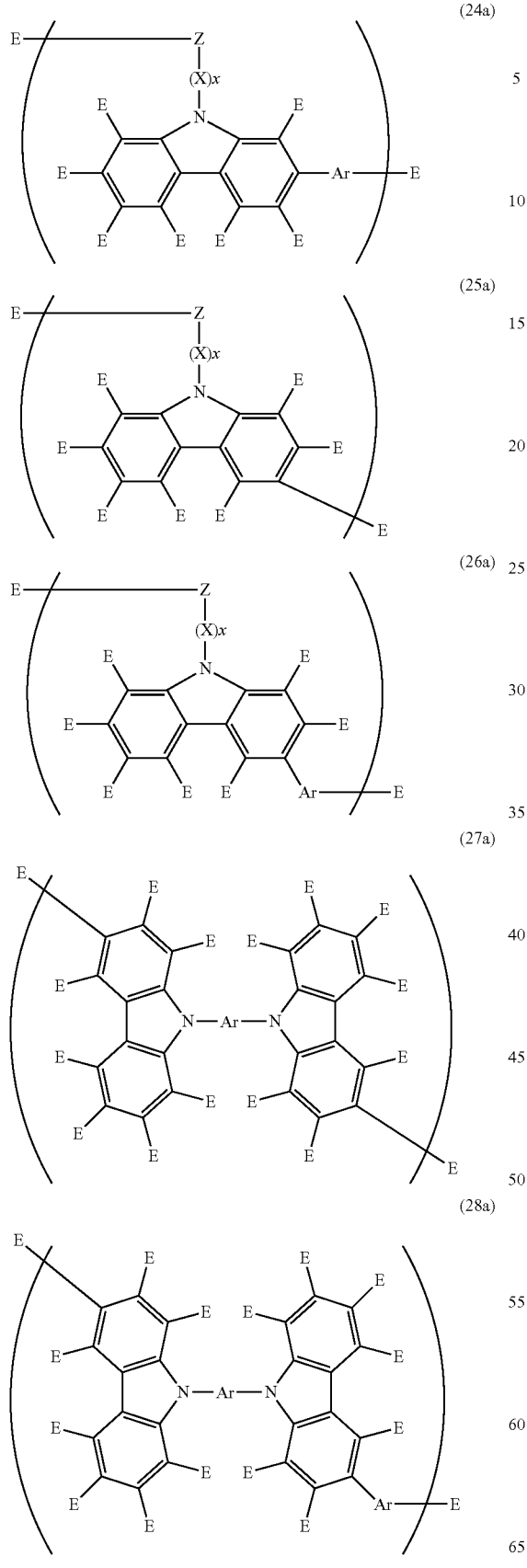
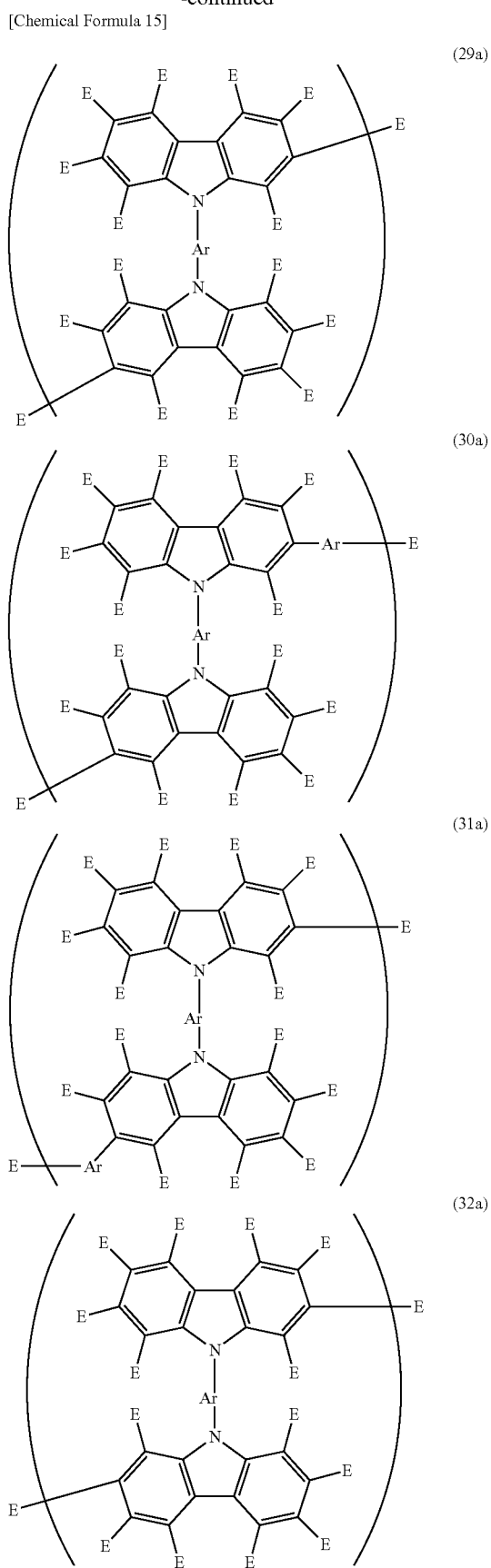

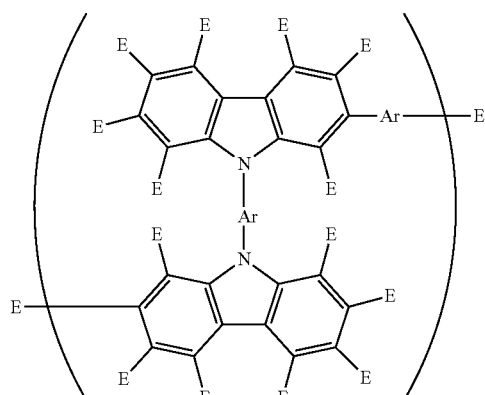
(33a)
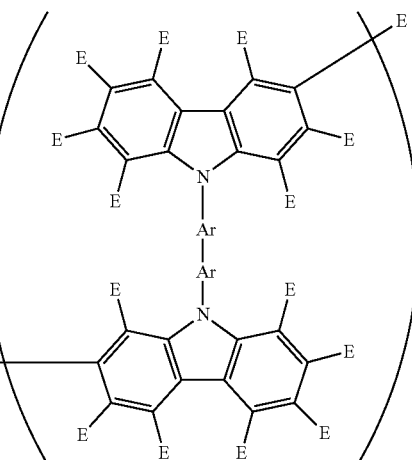
(36a)
[Chemical Formula 16]
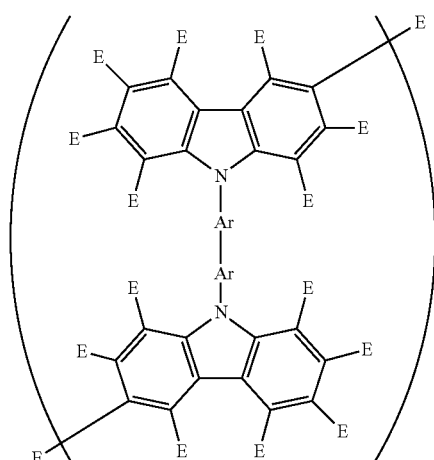
(34a)
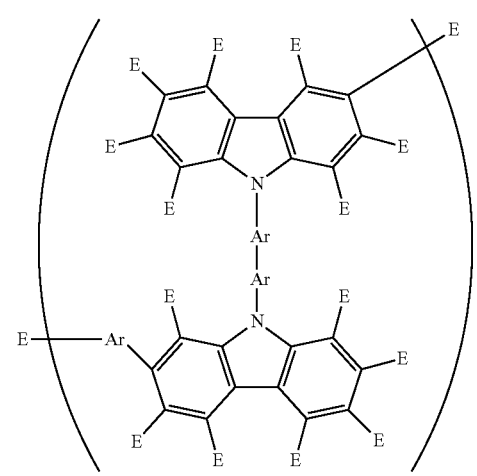
(37a)
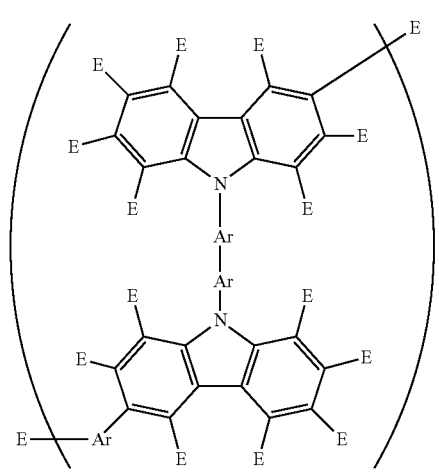
(35a)
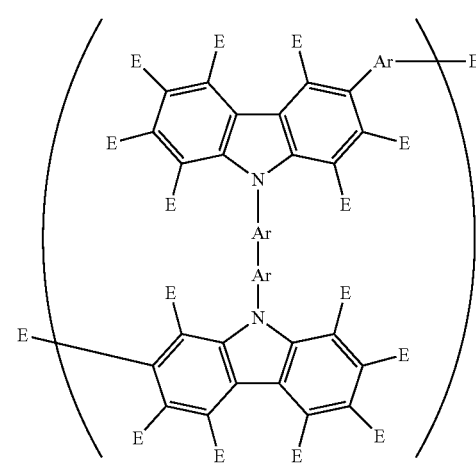
(38a)

[Chemical Formula 17]
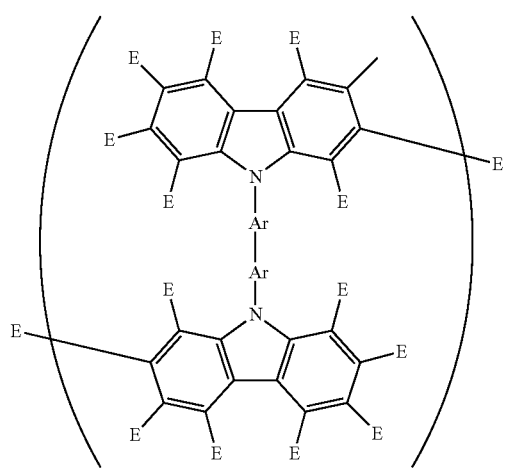
(39a)
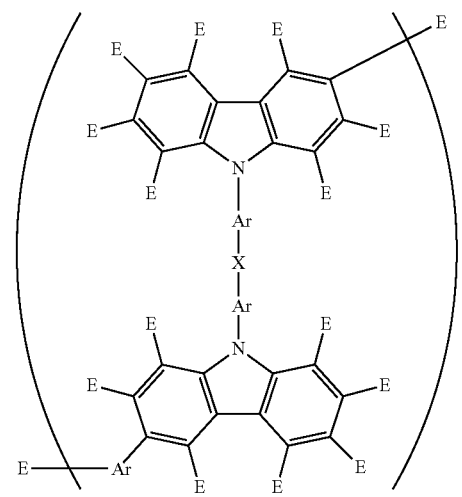
(42a)
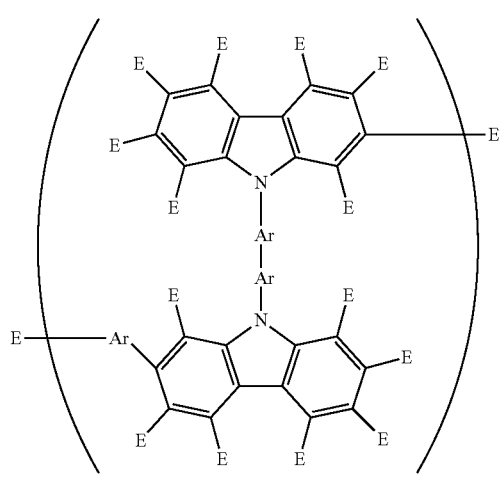
(40a)
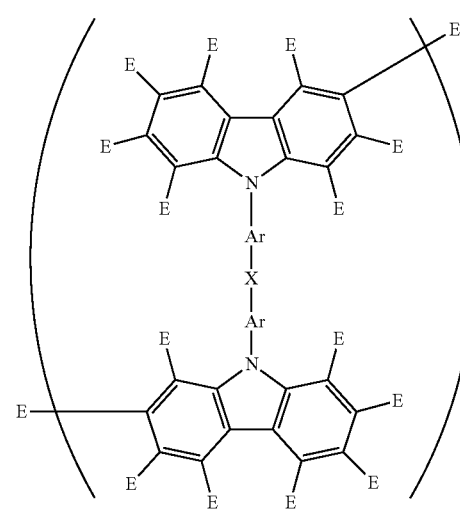
(43a)
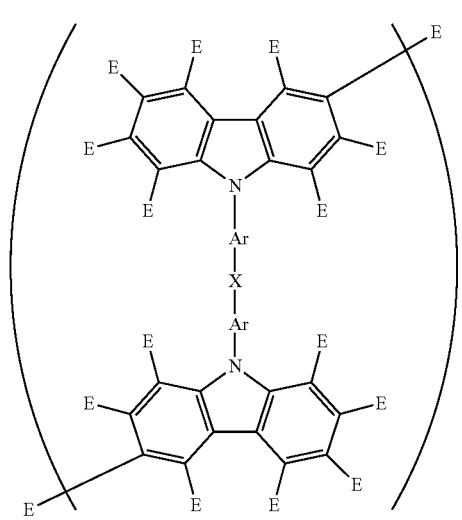
(41a)
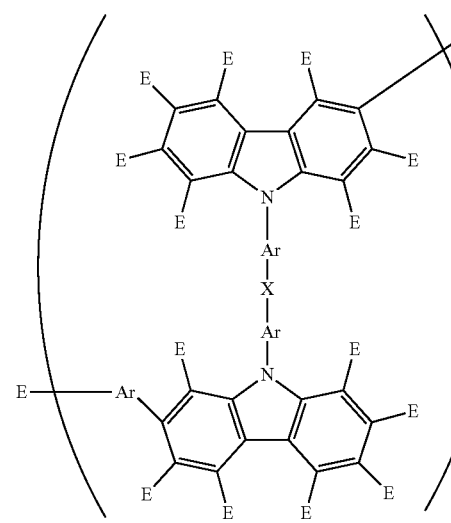
(44a)

[Chemical Formula 18]
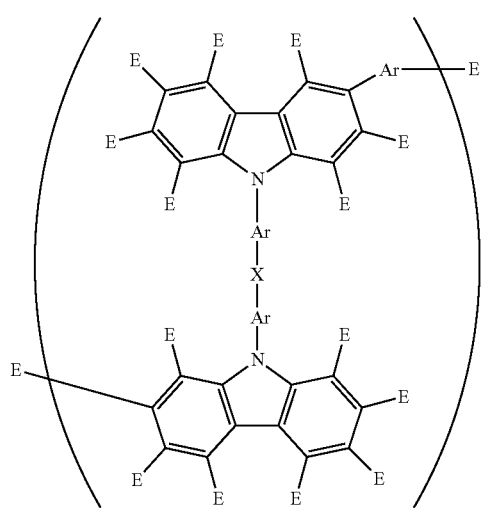
(45a)
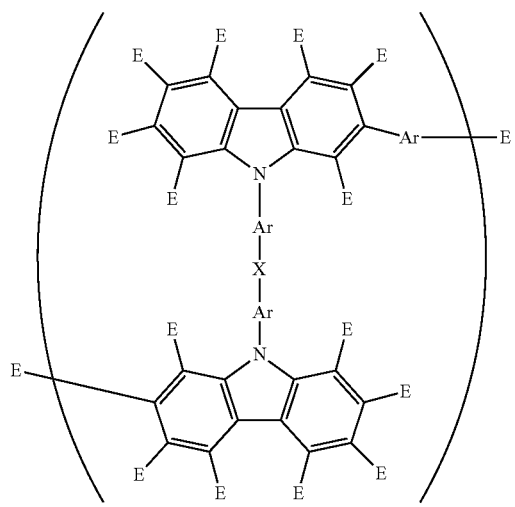
(46a)
(47a)
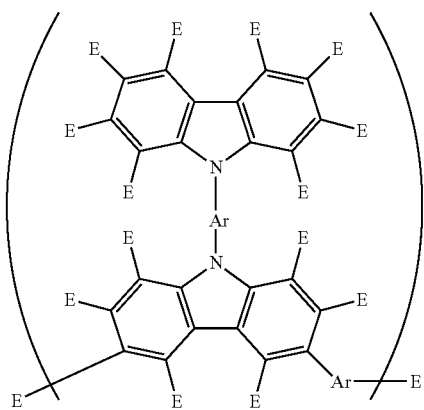
(48a)
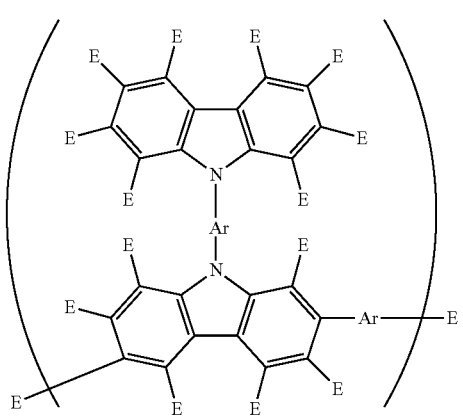
(49a)
[Chemical Formula 19]
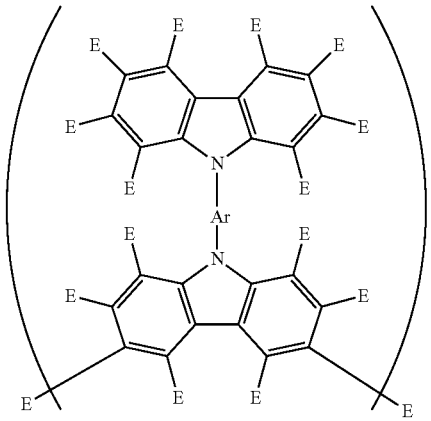
(50a)

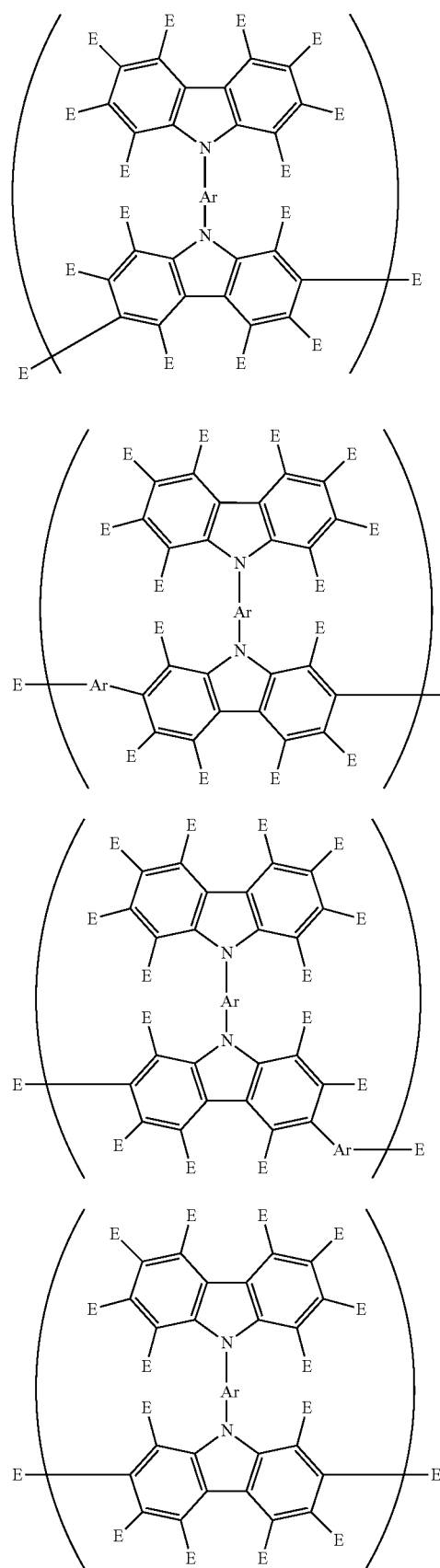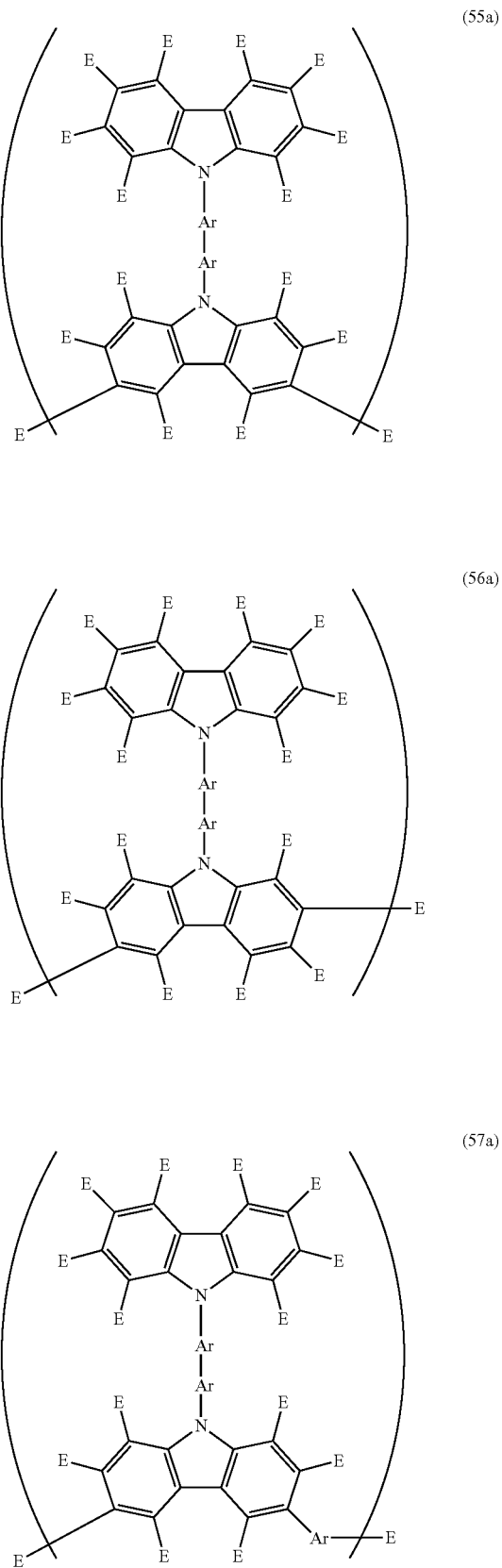

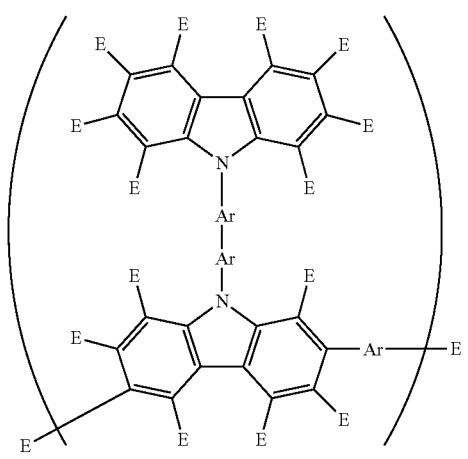
(58a)
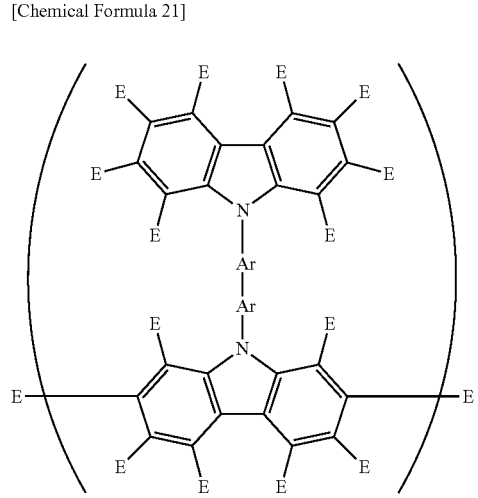
(61a)
[Chemical Formula 21]
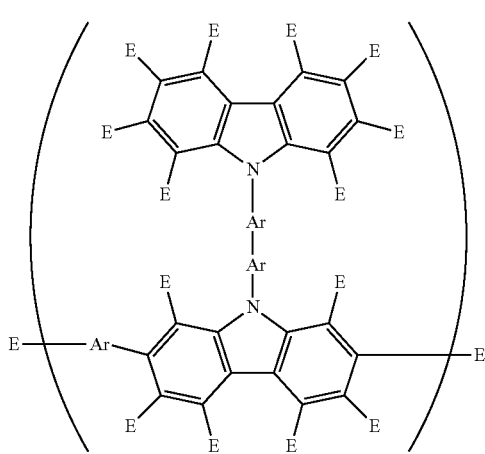
(59a)
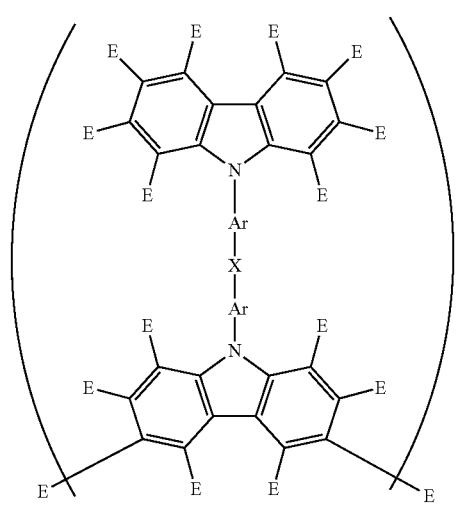
(62a)
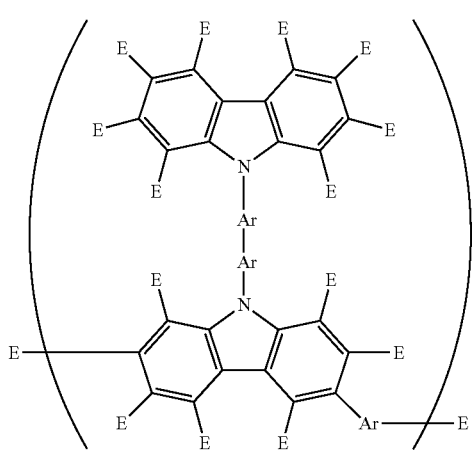
(60a)
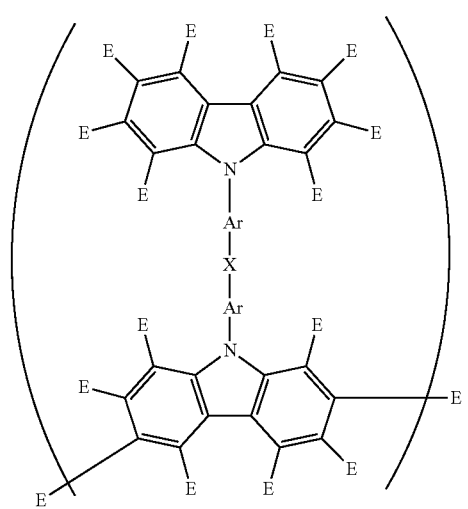
(63a)

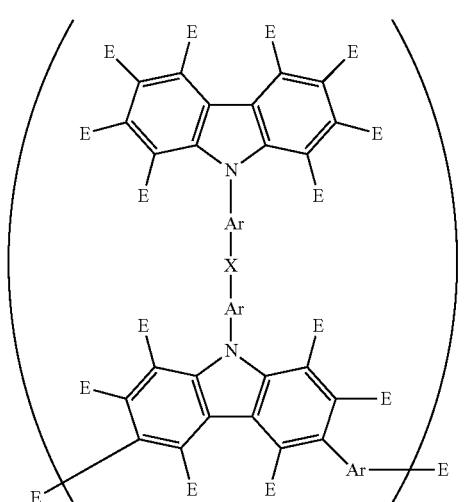
(64a)
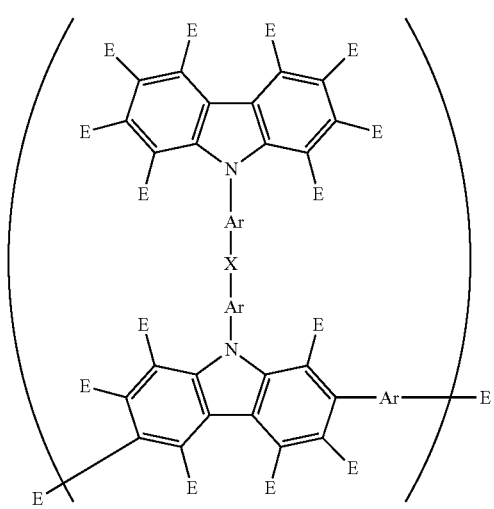
(65a)
[Chemical Formula 22]
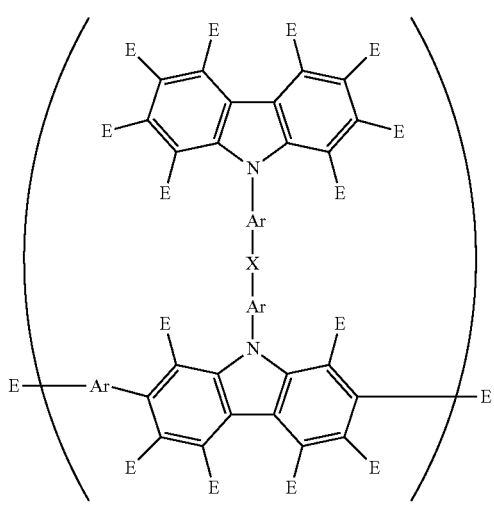
(66a)
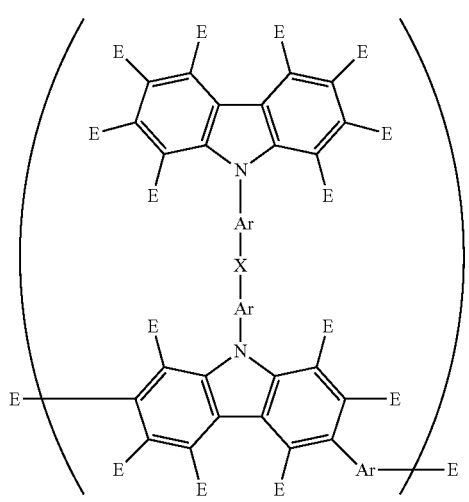
(67a)
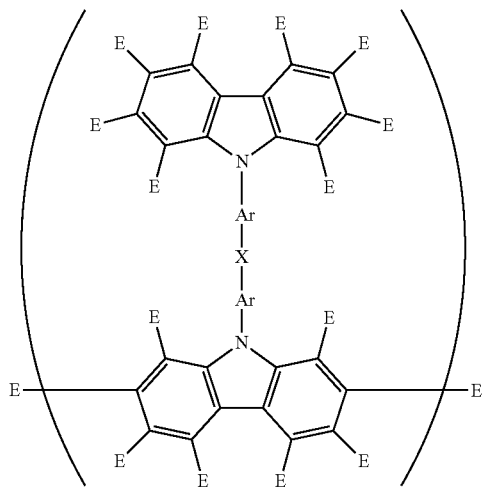
(68a)
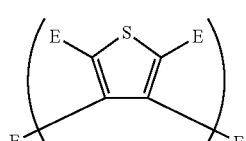
(69a)
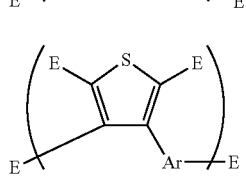
(70a)
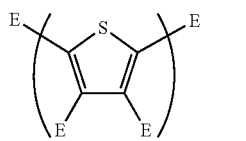
(71a)
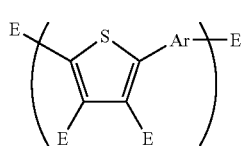
(72a)

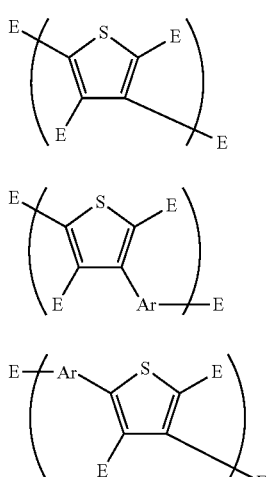

[Chemical Formula 23]

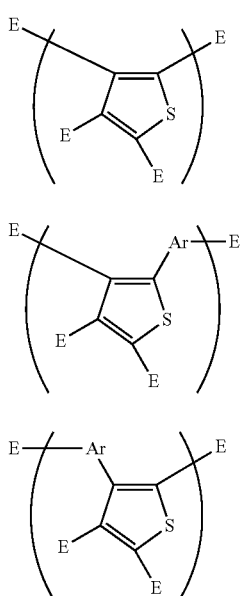

[Chemical Formula 24]

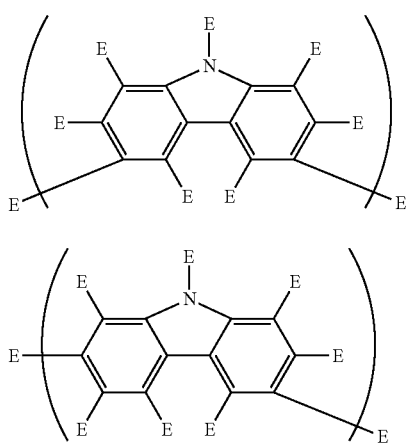

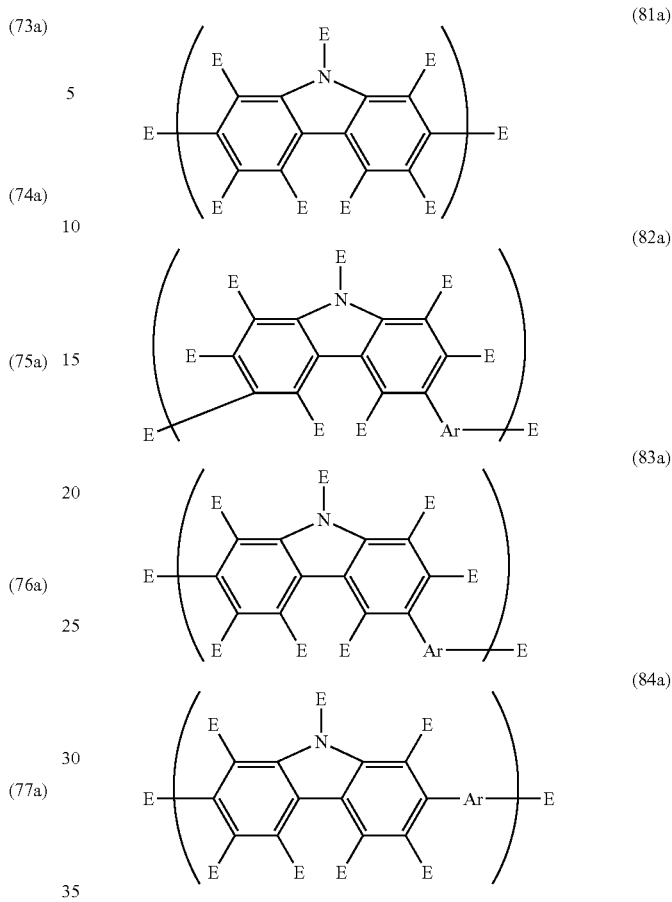

Furthermore, the polymer or oligomer may also be a copolymer having the arylene group, heteroarylene group, or a structure represented by one of the following formulas (C1) to (C30) as a copolymerization repeating unit, in addition to the repeating units described above, for the adjustment of solubility, heat resistance or electrical characteristics. In this case, the copolymer may be a random, block or graft copolymer, and may also be a polymer having an intermediate structure thereof, for example, a random copolymer having the characteristics of a block copolymer. Furthermore, the polymer or oligomer used in the present invention may have branches in the main chain, so that the polymer or oligomer may have three or more chain ends.

[Chemical Formula 25]

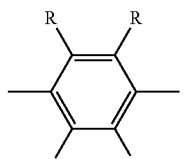
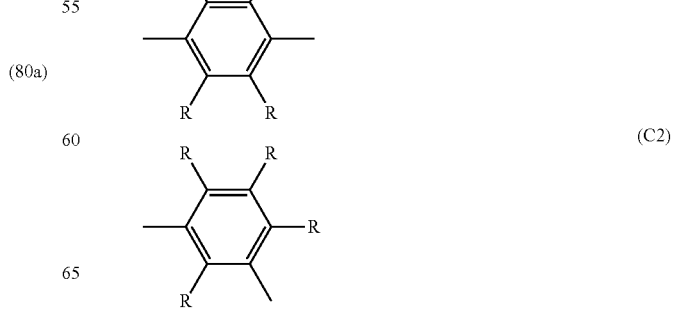

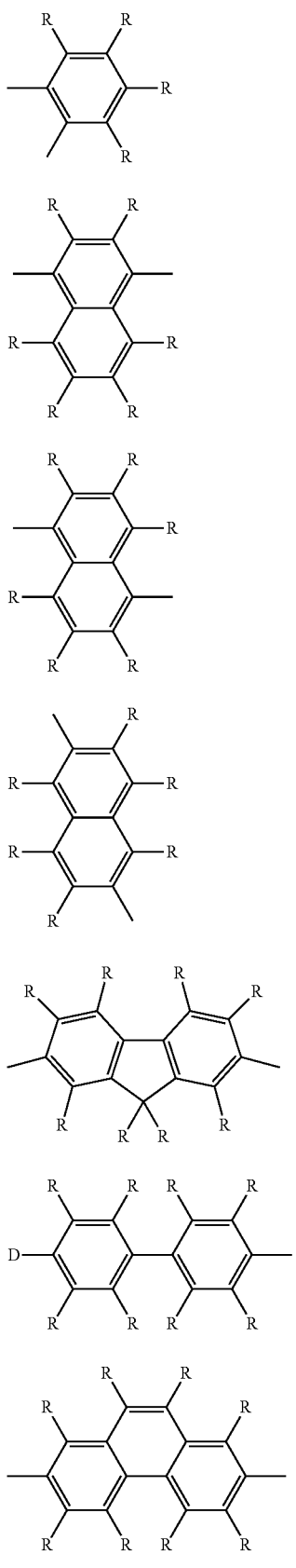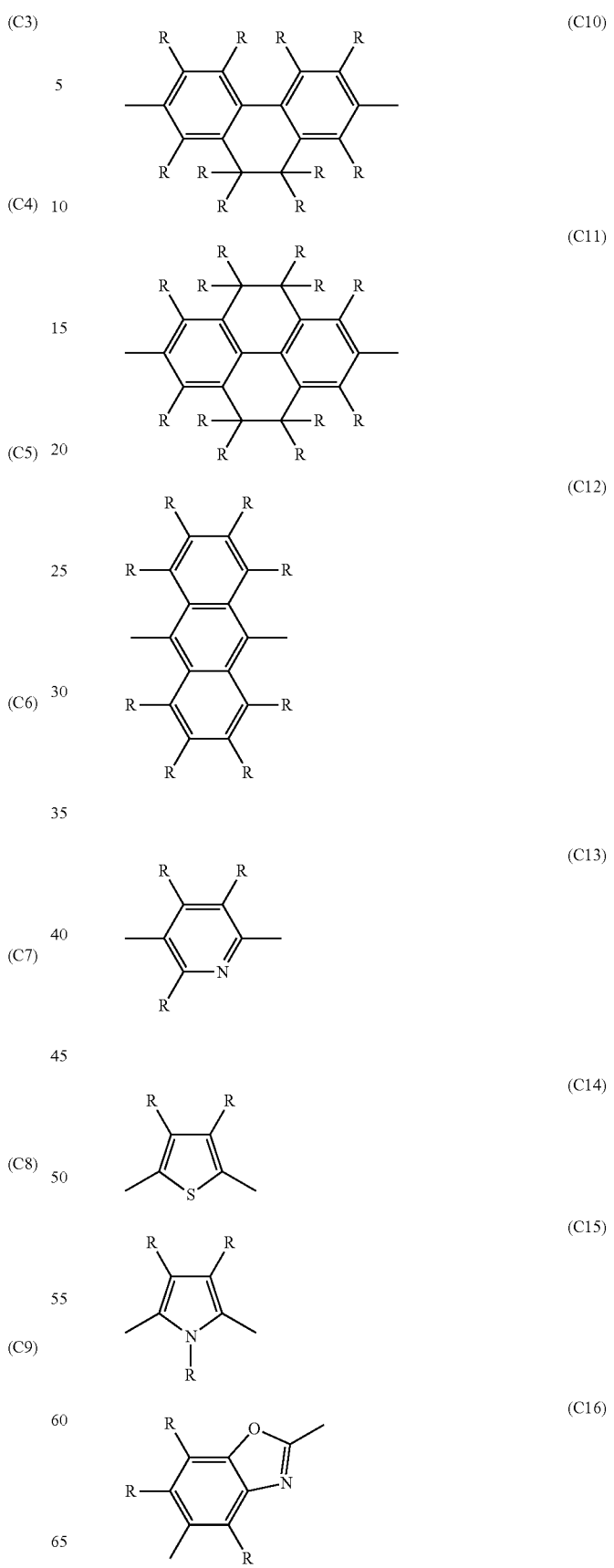

-continued
(C17) 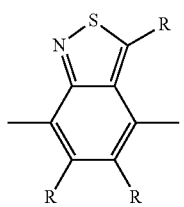
(C18) 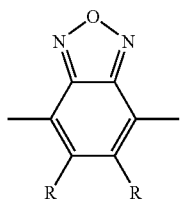
(C19) 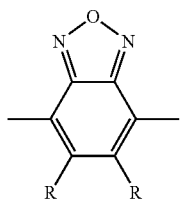
(C20) 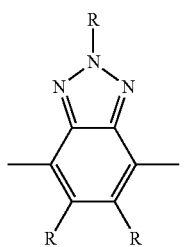
(C21) 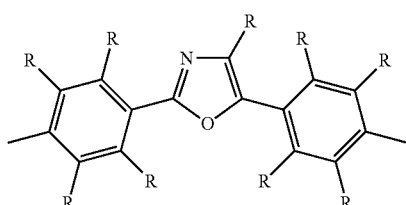
(C22) 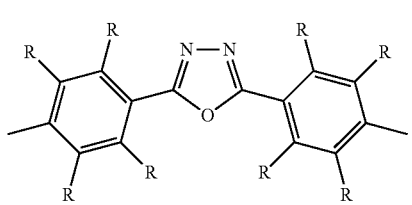
(C23) 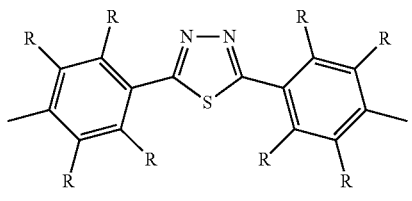
-continued
(C24) 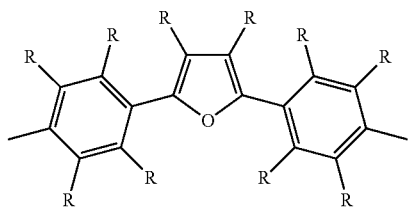
(C25) 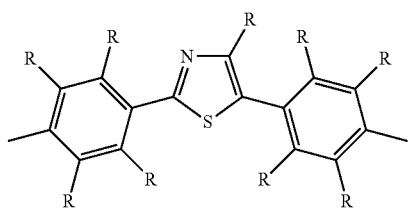
(C26) 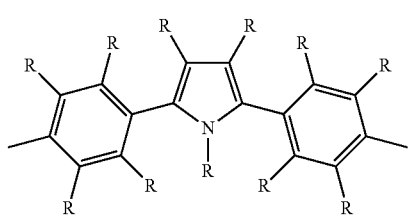
(C27) 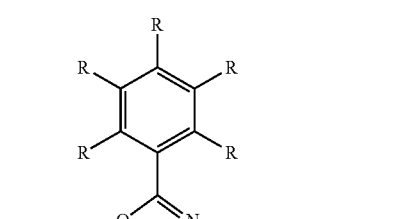
(C28) 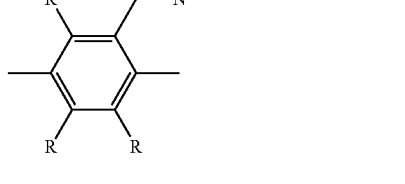
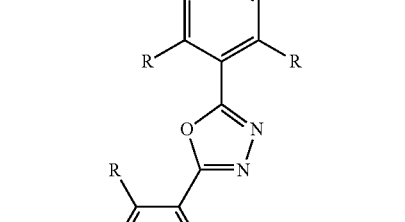
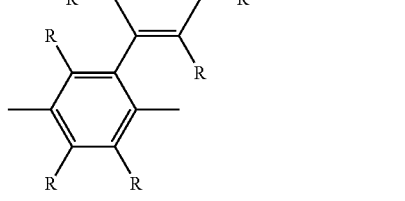

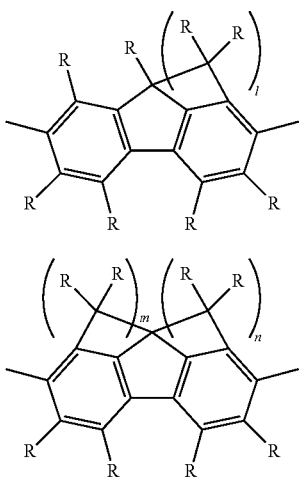

(C29)

(C30)

The "mixture containing a hole transporting compound having a polymerizable substituent" according to the present invention may further contain a polymerization initiator. This polymerization initiator may be any compound which exhibits an ability of polymerizing a polymerizable substituent by applying heat, light, microwaves, radiation, an electron beam or the like, and there are no particular limitations. However, a compound which discloses polymerization by light irradiation and/or heating is preferred, and a compound which initiates polymerization under the action of heat is more preferred.

In regard to the polymerization initiator, an onium salt is preferred as the compound which initiates polymerization by light irradiation and/or heating, or the compound which initiates polymerization under the action of heat.

Here, the onium salt according to the present invention means, for example, a compound composed of a cation such as sulfonium, iodonium, carbenium, selenium, ammonium, phosphonium, or bismuthonium, and a counter anion. The counter anion is the same as the counter anion of the ionic compound described in connection with the material for organic electronics of the present invention as described above.

Examples of the sulfonium ion include triarylsulfoniums such as triphenylsulfonium, tri-p-tolylsulfonium, tri-o-tolylsulfonium, tris(4-methoxyphenyl)sulfonium, 1-naphthyldiphenylsulfonium, 2-naphthyldiphenylsulfonium, tris(4-fluorophenyl)sulfonium, tri-1-naphthylsulfonium, tri-2-naphthylsulfonium, tris(4-hydroxyphenyl)sulfonium, 4-(phenylthio)phenyldiphenylsulfonium, 4-(p-tolylthio)phenyldi-p-tolylsulfonium, 4-(4-methoxyphenylthio)phenylbis(4-methoxyphenyl)sulfonium, 4-(phenylthio)phenylbis(4-fluorophenyl)sulfonium, 4-(phenylthio)phenylbis(4-methoxyphenyl)sulfonium, 4-(phenylthio)phenyldi-p-tolylsulfonium, bis[4-(diphenylsulfonio)phenyl]sulfide, bis[4-{bis[4-(2-hydroxyethoxy)phenyl]sulfonio}phenyl sulfide, bis{4-[bis(4-fluorophenyl)sulfonio]phenyl}sulfide, bis{4-[bis(4-methylphenyl)sulfonio]phenyl}sulfide, bis{4-[bis(4-methoxyphenyl)sulfonio]phenyl}sulfide, 4-(4-benzoyl-2-chlorophenylthio)phenylbis(4-fluorophenyl)sulfonium, 4-(4-benzoyl-2-chlorophenylthio)phenyldiphenylsulfonium, 4-(4-benzoylphenylthio)phenylbis(4-fluorophenyl)sulfonium, 4-(4-benzoylphenylthio)phenyldiphenylsulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(di-p-tolyl)sulfonio]thioxanthone, 2-[(diphenyl)sulfonio]thioxanthone, 4-[4-(4-tert-butylbenzoyl)phenylthio]phenyldi-p-tolylsulfonium, 4-[4-(4-tert-butylbenzoyl)phenylthio]phenyldiphenylsulfonium, 4-[4-(benzoylphenylthio)]phenyldi-p-tolylsulfonium, 4-[4-(benzoylphenylthio)]phenyldiphenylsulfonium, 5-(4-methoxyphenyl)thianthrenium, 5-phenylthianthrenium, 5-tolylthianthrenium, 5-(4-ethoxyphenyl)thianthrenium, and 5-(2,4,6-trimethylphenyl)thianthrenium; diarylsulfoniums such as diphenylphenacylsulfonium, diphenyl-4-nitrophenacylsulfonium, diphenylbenzylsulfonium, and diphenylmethylsulfonium; monoarylsulfoniums such as phenylmethylbenzylsulfonium, 4-hydroxyphenylmethylbenzylsulfonium, 4-methoxyphenylmethylbenzylsulfonium, 4-acetocarbonyloxyphenylmethylbenzylsulfonium, 2-naphthylmethylbenzylsulfonium, 2-naphthylmethyl-(1-ethoxycarbonyl)ethylsulfonium, phenylmethylphenacylsulfonium, 4-hydroxyphenylmethylphenacylsulfonium, 4-methoxyphenylmethylphenacylsulfonium, 4-acetocarbonyloxyphenylmethylphenacylsulfonium, 2-naphthylmethylphenacylsulfonium, 2-naphthyloctadecylphenacylsulfonium, and 9-anthracenylmethylphenacylsulfonium; trialkylsulfoniums such as dimethylphenacylsulfonium, phenacyltetrahydrothiophenium, dimethylbenzylsulfonium, benzyltetrahydrothiophenium, and octadecylmethylphenacylsulfonium; and the like, and these are described in the literatures described below.

In regard to the triarylsulfoniums, U.S. Pat. No. 4,231,951, U.S. Pat. No. 4,256,828, JP-A No. 7-61964, JP-A No. 8-165290, JP-A No. 7-10914, JP-A No. 7-25922, JP-A No. 8-27208, JP-A No. 8-27209, JP-A No. 8-165290, JP-A No. 8-301991, JP-A No. 9-143212, JP-A No. 9-278813, JP-A No. 10-7680, JP-A No. 10-287643, JP-A No. 10-245378, JP-A No. 8-157510, JP-A No. 10-204083, JP-A No. 8-245566, JP-A No. 8-157451, JP-A No. 7-324069, JP-A No. 9-268205, JP-A No. 9-278935, JP-A No. 2001-288205, JP-A No. 11-80118, JP-A No. 10-182825, JP-A No. 10-330353, JP-A No. 10-152495, JP-A No. 5-239213, JP-A No. 7-333834, JP-A No. 9-12537, JP-A No. 8-325259, JP-A No. 8-160606, JP-A No. 2000-186071 (U.S. Pat. No. 6,368,769), and the like; in regard to the diarylsulfoniums, JP-A No. 7-300504, JP-A No. 64-45357, JP-A No. 64-29419, and the like; in regard to the monoarylsulfoniums, JP-A No. 6-345726, JP-A No. 8-325225, JP-A No. 9-118663 (U.S. Pat. No. 6,093,753), JP-A No. 2-196812, JP-A No. 2-1470, JP-A No. 2-196812, JP-A No. 3-237107, JP-A No. 3-17101, JP-A No. 6-228086, JP-A No. 10-152469, JP-A No. 7-300505, JP-A No. 2003-277353, JP-A No. 2003-277352, and the like; in regard to the trialkylsulfoniums, JP-A No. 4-308563, JP-A No. 5-140210, JP-A No. 5-140209, JP-A No. 5-230189, JP-A No. 6-271532, JP-A No. 58-37003, JP-A No. 2-178303, JP-A No. 10-338688, JP-A No. 9-328506, JP-A No. 11-228534, JP-A No. 8-27102, JP-A No. 7-333834, JP-A No. 5-222167, JP-A No. 11-21307, JP-A No. 11-35613, U.S. Pat. No. 6,031,014, and the like may be mentioned.

Examples of the iodonium ion include diphenyliodonium, di-p-tolyliodonium, bis(4-dodecylphenyl)iodonium, bis(4-methoxyphenyl)iodonium, (4-octyloxyphenyl)phenyliodonium, bis(4-decyloxyphenyl)iodonium, 4-(2-hydroxytetradecyloxy)phenylphenyliodonium, 4-isopropylphenyl(p-tolyl)iodonium, isobutylphenyl(p-tolyl)iodonium, and the like. These are described in Macromolecules, 10, 1307 (1977), JP-A No. 6-184170, U.S. Pat. No. 4,256,828, U.S. Pat. No. 4,351,708, JP-A No. 56-135519, JP-A No.

58-38350, JP-A No. 10-195117, JP-A No. 2001-139539, JP-A No. 2000-510516, JP-A No. 2000-119306, and the like.

Examples of the carbenium cation include triarylcarboniums such as triphenylcarbenium cation, tri(methylphenyl)carbenium cation, and tri(dimethylphenyl)carbenium cation.

Examples of the selenium ion include triarylseleniums such as triphenylselenium, tri-p-tolylselenium, tri-o-tolylselenium, tris(4-methoxyphenyl)selenium, 1-naphthyldiphenylselenium, tris(4-fluorophenyl)selenium, tri-1-naphthylselenium, tri-2-naphthylselenium, tris(4-hydroxyphenyl)selenium, 4-(phenylthio)phenyldiphenylselenium, and 4-(p-tolylthio)phenyldi-p-tolylselenium; diarylseleniums such as diphenylphenacylselenium, diphenylbenzylselenium, and diphenylmethylselenium; monoarylseleniums such as phenylmethylbenzylselenium, 4-hydroxyphenylmethylbenzylselenium, phenylmethylphenacylselenium, 4-hydroxyphenylmethylphenacylselenium, and 4-methoxyphenylmethylphenacylselenium; trialkylseleniums such as dimethylphenacylselenium, phenacyltetrahydroselenophenium, dimethylbenzylselenium, benzyltetrahydroselenophenium, and octadecylmethylphenacylselenium; and the like. These are described in JP-A No. 50-151997, JP-A No. 50-151976, JP-A No. 53-22597, and the like.

Examples of the ammonium ion include tetraalkylammoniums such as tetramethylammonium, ethyltrimethylammonium, diethyldimethylammonium, triethylmethylammonium, tetraethylammonium, trimethyl-n-propylammonium, trimethylisopropylammonium, trimethyl-n-butylammonium, trimethylisobutylammonium, trimethyl-t-butylammonium, trimethyl-n-hexylammonium, dimethyldi-n-propylammonium, dimethyldiisopropylammonium, dimethyl-n-propylisopropylammonium, methyltri-n-propylammonium, and methyltriisopropylammonium; pyrrolidiniums such as N,N-dimethylpyrrolidinium, N-ethyl-N-methylpyrrolidinium, and N,N-diethylpyrrolidinium; imidazoliniums such as N,N'-dimethylimidazolinium, N,N'-diethylimidazolinium, N-ethyl-N'-methylimidazolinium, 1,2,3-trimethylimidazolinium, 1,3,4-trimethylimidazolinium, 1,3-diethyl-2-methylimidazolinium, 1,3-diethyl-4-methylimidazolinium, and 1,2,3,4-tetramethylimidazolinium; tetrahydropyrimidiniums such as N,N'-dimethyltetrahydropyrimidinium, N,N'-diethyltetrahydropyrimidinium, N-ethyl-N'-methyltetrahydropyrimidinium, and 1,2,3-trimethyltetrahydropyrimidinium; morpholiniums such as N,N'-dimethylmorpholinium, N-ethyl-N-methylmorpholinium, and N,N-diethylmorpholinium; piperidiniums such as N,N-dimethylpiperidinium, N-ethyl-N'-methylpiperidinium, and N,N'-diethylpiperidinium; pyridiniums such as N-methylpyridinium, N-ethylpyridinium, N-n-propylpyridinium, N-isopropylpyridinium, N-n-butylpyridinium, N-benzylpyridinium, and N-phenacylpyridium; imidazoliums such as N,N'-dimethylimidazolium, N-ethyl-N-methylimidazolium, N,N'-diethylimidazolium, 1,2-diethyl-3-methylimidazolium, 1,3-diethyl-2-methylimidazolium, and 1-methyl-3-n-propyl-2,4-dimethylimidazolium; quinoliums such as N-methylquinolium, N-ethylquinolium, N-n-propylquinolium, N-isopropylquinolium, N-n-butylquinolium, N-benzylquinolium, and N-phenacylquinolium; isoquinoliums such as N-methylisoquinolium, N-ethylisoquinolium, N-n-propylisoquinolium, N-isopropylisoquinolium, N-n-butylisoquinolium, N-benzylisoquinolium, and N-phenacylisoquinolium; thiazoniums such as benzylbenzothiazonium, and phenacylbenzothiazonium; and acridiums such as benzylacridium, and phenacylacridium.

These are described in U.S. Pat. No. 4,069,055, Japanese Patent No. 2519480, JP-A No. 5-222112, JP-A No. 5-222111, JP-A No. 5-262813, JP-A No. 5-255256, JP-A No. 7-109303, JP-A No. 10-101718, JP-A No. 2-268173, JP-A No. 9-328507, JP-A No. 5-132461, JP-A No. 9-221652, JP-A No. 7-43854, JP-A No. 7-43901, JP-A No. 5-262813, JP-A No. 4-327574, JP-A No. 2-43202, JP-A No. 60-203628, JP-A No. 57-209931, JP-A No. 9-221652, and the like.

Examples of the phosphonium ion include tetraarylphosphoniums such as tetraphenylphosphonium, tetra-p-tolylphosphonium, tetrakis(2-methoxyphenyl)phosphonium, tetrakis(3-methoxyphenyl)phosphonium, and tetrakis(4-methoxyphenyl)phosphonium; triarylphosphoniums such as triphenylbenzylphosphonium, triphenylphenacylphosphonium, triphenylmethylphosphonium, and triphenylbutylphosphonium; tetraalkylphosphoniums such as triethylbenzylphosphonium, tributylbenzylphosphonium, tetraethylphoshponium, tetrabutylphosphonium, tetrahexylphosphonium, triethylphenacylphosphonium, and tributylphenacylphosphonium; and the like.

These are described in JP-A No. 6-157624, JP-A No. 5-105692, JP-A No. 7-82283, JP-A No. 9-202873, and the like.

Examples of the bismuthonium ion are described in, for example, JP-A No. 2008-214330.

The onium salt used in the present invention is composed of the counter cation and the counter anion described above. There are no particular limitations on this combination as long as it is a combination with a balanced charge. However, in order to decrease the driving voltage of the organic EL element through one-electron oxidation of the hole transporting compound, fluorophosphoric acid ions such as $PF_6^-$ and $PF_5OH^-$; fluorinated alkylfluorophosphoric acid ions such as $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$ and $[((CF_3)_2CFCF_2)_2PF_4]^-$; boric acid ions such as $BF_4^-$, $B(C_6F_5)_4^-$, and $B(C_6H_4CF_3)_4^-$; and fluoroantimonic acid ions such as $SbF_6^-$ and $SbF_5OH^-$ are preferred, and in order to produce a thin film of a charge transporting compound having a polymerizable substituent at a lower temperature, combinations with cations such as sulfonium, iodonium, carbenium, and ammonium are more preferred. In order to lengthen the service life of the organic EL element, combinations of carbenium or ammonium cations with boric acid ions such as $B(C_6F_5)_4^-$ and $B(C_6H_4CF_3)_4^-$; fluoroantimonic acid ions such as $SbF_6^-$ and $SbF_5OH^-$; fluorophosphoric acid ions such as $F_6^-$ and $PF_5OH^-$; and fluorinated alkylfluorophosphoric acid ions such as $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$ and $[((CF_3)_2CFCF_2)_2PF_4]^-$ are more preferred.

Particularly, as the polymerization initiator, even among the onium salts, ionic compounds having a counter cation selected from the group consisting of a carbocation, a nitrogen cation, an oxygen cation, and a cation having a transition metal, that is, the ionic compounds described in connection with the material for organic electronics of the present invention described above, are preferred.

(Solvent)

There are no particular limitations on the solvent for preparing a coating liquid for forming the polymerized layer, but specific examples include alcohols such as methanol, ethanol, and isopropyl alcohol; alkanes such as pentane, hexane, and octane; cyclic alkanes such as cyclohexane; aromatic solvents such as benzene, toluene, xylene, mesitylene, tetraline, and diphenylmethane; aliphatic ethers such as ethylene glycol dimethyl ether, ethylene glycol diethyl ether, and propylene glycol-1-monomethyl ether acetate;

aromatic ethers such as 1,2-dimethoxybenzene, 1,3-dimethoxybenzene, anisole, phenethol, 2-methoxytoluene, 3-methoxytoluene, 4-methoxytoluene, 2,3-dimethylanisole, and 2,4-dimethylanisole; aliphatic esters such as ethyl acetate, n-butyl acetate, ethyl lactate, and n-butyl lactate; aromatic esters such as phenyl acetate, phenyl propionate, methyl benzoate, ethyl benzoate, propyl benzoate, and n-butyl benzoate; amide-based solvents such as N,N-dimethylformamide and N,N-dimethylacetamide; as well as dimethyl sulfoxide, tetrahydrofuran, acetone, chloroform, methylene chloride, and the like. Preferred examples include aromatic solvents, aliphatic ethers, aromatic ethers, aliphatic esters, and aromatic esters.

Any of these may be used singly, or any combination of two or more kinds at any ratio may also be used.
(Ratio)

The ratio of the polymerization initiator used in the present invention is preferably 0.01% to 100% by mass, preferably 0.05% to 50% by mass, and most preferably 0.1% to 100% by mass, relative to 100 parts of the hole transporting compound having a polymerizable substituent. If the ratio of the polymerization initiator is 0.01% by mass or less, polymerization does not proceed sufficiently, and if the ratio is 100% by mass or more, the film quality tends to deteriorate.

[Light Emitting Layer, Substrate, Cathode, Anode, Electron Transport Layer, and Electron Injection Layer]

The light emitting layer, substrate, cathode, anode, electron transport layer, and electron injection layer formed in the organic EL element of the second embodiment of the present invention are the same as those of the first embodiment described above, and preferred examples thereof, the methods for forming the layers, and the like are also the same as those of the first embodiment. Therefore, the descriptions on the light emitting layer, substrate, cathode, anode, electron transport layer and electron injection layer according to the first embodiment described above also directly apply to the second embodiment.

[Method for Forming Thin Film]

In order to form various layers in the organic EL element of the first and second embodiments described above, the layers can be formed by, for example, producing the layers according to a coating method of applying a solution containing the material for organic electronics on a desired substrate by a known method such as an ink-jet method, a casting method, an immersion method, a printing method such as relief printing, intaglio printing, offset printing, lithographic printing, reverse relief offset printing, screen printing or gravure printing, or a spin coating method.

Furthermore, when a thin film produced by a coating method such as described above is subjected to a polymerization reaction by light irradiation, a heating treatment, or the like, the solubility of the coating layer can be modified (cured). As such an operation is repeated, multilayering of the organic EL element formed by a coating method can be attempted.

The coating method such as described above can be carried out usually at a temperature in the range of −20° C. to +300° C., preferably 10° C. to 100° C., and particularly preferably 15° C. to 50° C.

Furthermore, in the process of light irradiation, a light source such as a low pressure mercury lamp, a medium pressure mercury lamp, a high pressure mercury lamp, an ultrahigh pressure mercury lamp, a metal halide lamp, a xenon lamp, a fluorescent lamp, a light emitting diode, or sunlight can be used. The heating treatment can be carried out on a hot plate or in an oven, and can be carried out at a temperature in the range of 0° C. to +300° C., preferably 20° C. to 250° C., more preferably 50° C. to 200° C., and even more preferably 70° C. to 150° C. At a low temperature, there are problems that the curing reaction does not proceed sufficiently, and the solvent remains behind, and as a result, the service life of the organic EL element decreases. At a high temperature, it is difficult to produce an organic EL element on a resin substrate. Further, the curing reaction after coating is preferably carried out only by a heating treatment, for the lengthening of the service life of the organic EL element.

[Color of Emitted Light]

The color of the emitted light in the organic EL element of the present invention is not particularly limited, but a white light emitting element is preferred because the element can be used in various illuminating apparatuses for domestic lighting, car interior lighting, backlights of clocks or liquid crystal devices, and the like.

In regard to the method for forming a white light emitting element, since it is currently difficult to show white light emission with a single material, white light emission is obtained by simultaneously emitting plural colors of emitted light using plural light emitting materials, and making a mixed color. There are no particular limitations on the combination of plural colors of emitted light, but examples include a combination which includes three maximum emission wavelengths of blue, green and red, and a combination which utilizes the relations of complementary colors such as blue and yellow, or yellow-green and orange color, and includes two maximum emission wavelengths.

Furthermore, the control of the color of emitted light can be carried out by adjusting the type and amount of the phosphorescent material.

<Display Element, Illuminating Device, and Display Device>

The display element of the present invention is characterized in that the display element includes the organic EL element of the present invention described above.

For example, when the organic EL element of the present invention is used as an element corresponding to each of the pixels of red, green and blue (RGB), a color display element is obtained.

In regard to the formation of an image, there are available a simple matrix type in which individual organic EL elements that are arrayed in a panel are directly driven by an electrode disposed in a matrix form, and an active matrix type in which a thin film transistor is disposed and driven in each of the elements. The former involves a simple structure, but since there is a limitation on the number of vertical pixels, the former is used in the display of characters and the like. The latter is such that since high-accuracy, bright images are obtained even with a low driving voltage and a small current, the latter is used for high resolution display devices.

Furthermore, the illuminating device of the present invention is characterized in that the illuminating device includes the organic EL element of the present invention described above. Furthermore, the display device of the present invention is characterized in that the display device includes an illuminating device and a liquid crystal element as a display unit. The display device of the present invention may also be a display device which uses the illuminating device of the present invention mentioned above as a backlight (white light emission source), and uses a liquid crystal element as a display unit, that is, a liquid crystal display device. This constitution is the same as the constitution of known liquid crystal devices, except that only the backlight is substituted with the illuminating device of the present invention, and known technologies can be redeployed for the liquid crystal element portion.

EXAMPLES

Hereinafter, the present invention will be more specifically described by way of Examples, but the present invention is not intended to be limited to the following Examples.

Example 1

Evaluation of Polymerizability

A coating solution prepared by mixing a toluene solution (400 μl) of a compound 1 (4.5 mg) shown below and an ethyl acetate solution (100 μl) of an ionic compound 1 (0.45 g) shown below, was spin coated on a quartz plate at 3000 rpm. Subsequently, the coated quartz plate was heated on a hot plate at 120° C. for 10 minutes to carry out a polymerization reaction. After the heating, the quartz plate was immersed for one minute in a solvent mixture of toluene:ethyl acetate (4:1), and was washed. The residual film ratio was measured from the ratio of the absorbances (Abs) of the maximum absorption (λmax) in the UV-vis spectrum obtained before and after washing.

Before washing: λmax=383 nm, Abs=0.229
After washing: λmax=383 nm, Abs=0.228

Residual film ratio (%)=Abs after washing/Abs before washing×100=0.228/0.229×100=99.6

[Chemical Formula 26]

Compound 1

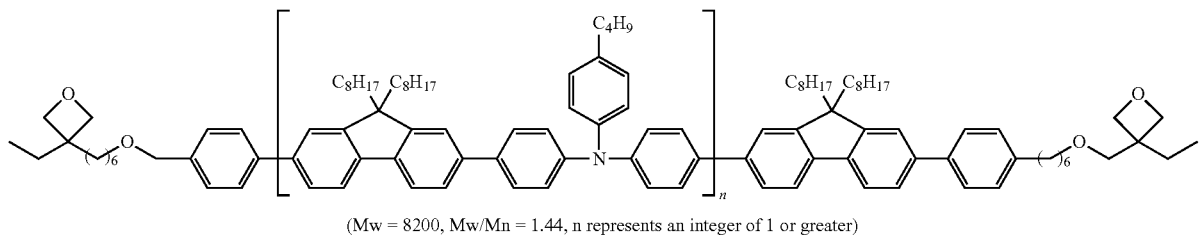

(Mw = 8200, Mw/Mn = 1.44, n represents an integer of 1 or greater)

[Chemical formula 27]

Ionic compound 1

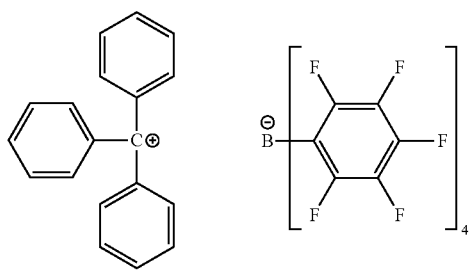

Example 2

The residual film ratio was measured all in the same manner as in Example 1, except that the heating temperature on the hot plate was set to 180° C.

Example 3

The residual film ratio was measured all in the same manner as in Example 1, except that an ionic compound 2 as shown below was used in place of the ionic compound 1.

[Chemical Formula 28]

Ionic compound 2

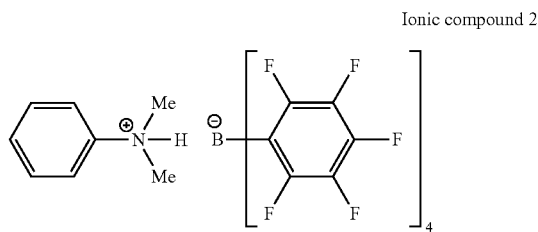

Example 4

The residual film ratio was measured all in the same manner as in Example 3, except that the heating temperature on the hot plate was set to 180° C.

Comparative Example 1

The residual film ratio was measured all in the same manner as in Example 1, except that an ionic compound 3 as shown below was used in place of the ionic compound 1.

[Chemical Formula 29]

Ionic compound 3

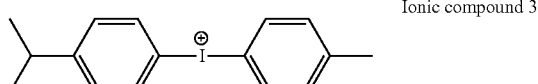

-continued

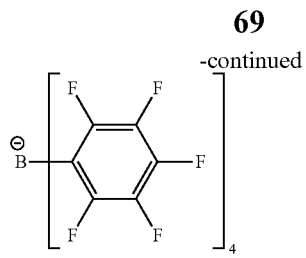

Comparative Example 2

The residual film ratio was measured all in the same manner as in Comparative Example 1, except that the heating temperature on the hot plate was set to 180° C.

Comparative Example 3

The residual film ratio was measured all in the same manner as in Example 1, except that an ionic compound 4 as shown below was used in place of the ionic compound 1.

[Chemical Formula 30]

Ionic compound 4

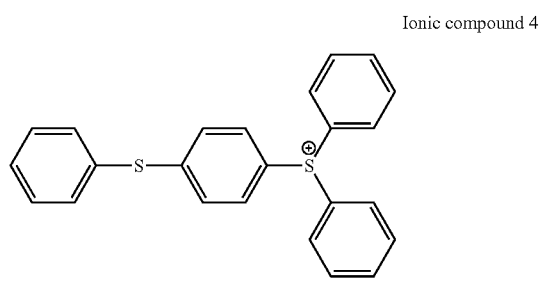

Comparative Example 4

The residual film ratio was measured all in the same manner as in Comparative Example 3, except that the heating temperature on the hot plate was set to 180° C.

Comparative Example 5

The residual film ratio was measured all in the same manner as in Example 1, except that an ionic compound 5 as shown below was used in place of the ionic compound 1.

[Chemical Formula 31]

Ionic compound 5

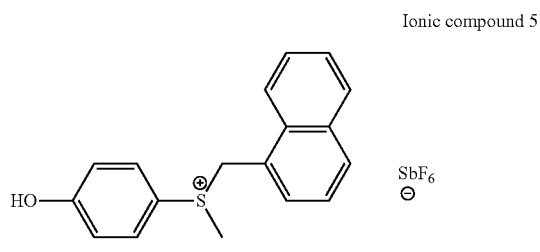

Comparative Example 6

The residual film ratio was measured all in the same manner as in Comparative Example 5, except that the heating temperature on the hot plate was set to 180° C.

The results of evaluating the residual film ratios obtained at 120° C. and 180° C. using the various ionic compounds are summarized in Table 1. It can be seen that when the ionic compounds according to the present invention are used, the effects are exhibited even at a low temperature, as compared with the case of using conventional onium salt type curing agents.

TABLE 1

| Item | Residual film ratio after 120° C.-10 min (%) | Residual film ratio after 180° C.-10 min (%) |
|---|---|---|
| Example 1 | 99.6 | 99.6 |
| Example 2 | 99.6 | 99.6 |
| Example 3 | 99.1 | 99.6 |
| Example 4 | 99.1 | 99.6 |
| Comparative Example 1 | 5.2 | 99.1 |
| Comparative Example 2 | 5.2 | 99.1 |
| Comparative Example 3 | 0.9 | 12.3 |
| Comparative Example 4 | 0.9 | 12.3 |
| Comparative Example 5 | 65.8 | 95.0 |
| Comparative Example 6 | 65.8 | 95.0 |

Example 5

On a glass substrate having an ITO pattern with a width of 1.6 mm, a coating solution prepared by mixing a toluene solution (400 µl) of the compound 1 (4.5 mg) and an ethyl acetate solution (100 µl) of the ionic compound 1 (0.45 g), was spin coated on the glass substrate at 3000 rpm. The subsequent experiment procedure was carried out in a dry nitrogen environment. Subsequently, the glass substrate was heated on a hot plate at 180° C. for 10 minutes to cure the compounds, and thus a hole injection layer (40 nm) was formed.

Subsequently, a toluene solution (1.0% by mass) of a mixture containing a polymer 1 (75 parts by mass), a polymer 2 (20 parts by mass), and a polymer 3 (5 parts by mass), which are represented by the structural formulas shown below, was spin coated on the hole injection layer at 3000 rpm. The glass substrate was heated on a hot plate at 80° C. for 5 minutes, and thus a polymer light emitting layer (thickness 80 nm) was formed. Meanwhile, the hole injection layer and the light emitting layer could be laminated without dissolving each other.

[Chemical Formula 32]

Polymer 1

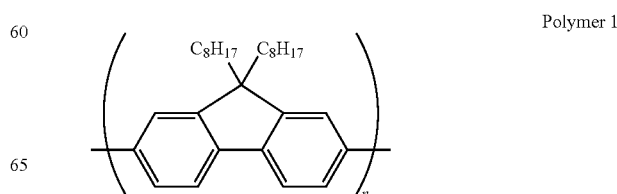

Polymer 2

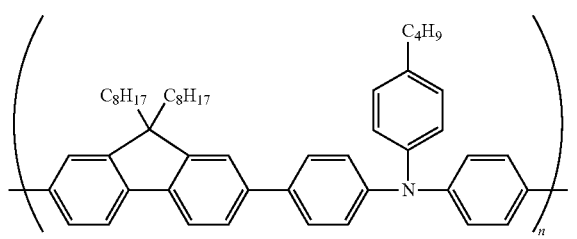

Polymer 3

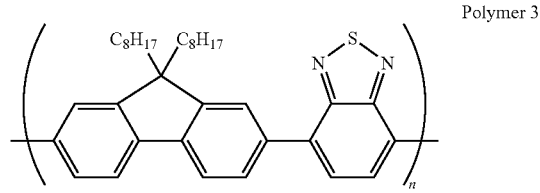

wherein n represents an integer of 1 or greater.

The glass substrate thus obtained was transferred into a vacuum deposition machine, and electrodes were formed on the light emitting layer in order of Ba (thickness 3 nm) and Al (thickness 100 nm).

After the formation of electrodes, the substrate was transferred into a dry nitrogen environment without being exposed to the atmosphere, and encapsulation was carried out by pasting an encapsulating glass, which was a 0.7-mm alkali-free glass having 0.4-mm countersinks provided thereon, and an ITO-patterned glass substrate on the substrate using a photocurable epoxy resin. Thus, a high molecular weight organic EL element having a multilayer structure was produced. The subsequent experiment procedure was carried out at room temperature (25° C.) in air.

A voltage was applied by using the ITO of this organic EL element as a positive electrode and Al as a negative electrode, and green light emission was observed at about 3 V. The current efficiency at a luminance of 5000 cd/m$^2$ was 9.1 cd/A, and the driving voltage was 4.9 V. Furthermore, for the lifetime characteristics, a constant current at a current density of 13 mA/cm$^2$ was applied, and the luminance half-life was measured, which was found to be 340 hours.

Comparative Example 7

A high molecular weight organic EL element having a multilayer structure was produced all in the same manner as in Example 5, except that the ionic compound 1 was changed to the ionic compound 3. A voltage was applied by using the ITO of this organic EL element as a positive electrode and Al as a negative electrode, and green light emission was observed at about 3.5 V. The current efficiency at a luminance of 5000 cd/m$^2$ was 6.9 cd/A, and the driving voltage was 5.9 V. Furthermore, for the lifetime characteristics, a constant current at a current density of 14 mA/cm$^2$ was applied, and the luminance half-life was measured, which was found to be 70 hours. As compared with Example 5, the driving voltage was higher, and the luminance half-life was also significantly shorter.

Example 6

Characteristics of Organic EL Element

Production of Organic EL Element

On a glass substrate having an ITO pattern with a width of 1.6 mm, a coating solution prepared by dissolving a compound 1 (3.9 mg) shown below and a compound 2 (0.6 mg, weight average molecular weight (Mw) 247,000, Mw/Mn=1.65, Mn represents the number average molecular weight) shown below in toluene (1.2 ml), dissolving a polymerization initiator (0.45 mg) represented by the formula shown below in ethyl acetate (100 μl), and mixing the solutions, was spin coated at 3000 rpm. Subsequently, the glass substrate was heated on a hot plate at 180° C. for 10 minutes to cure the compounds, and thus a hole injection layer (30 nm) was formed.

[Chemical Formula 33]

Compound 1

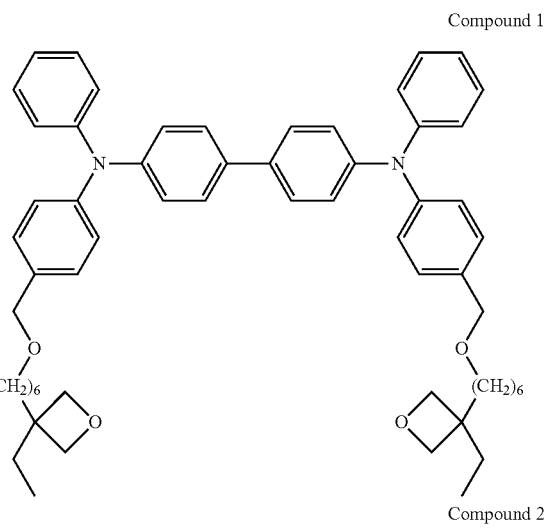

Compound 2

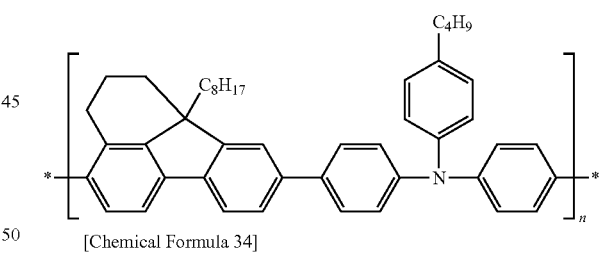

[Chemical Formula 34]

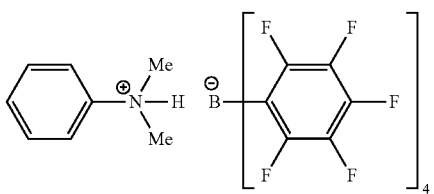

Polymerization initiator

Furthermore, a coating solution prepared by dissolving a compound 3 (4.5 mg, weight average molecular weight 5,700 Mw/Mn=1.94) shown below in toluene (1.2 ml), dissolving the above-shown polymerization initiator (0.45 mg) in ethyl acetate (100 μl), and mixing the solutions, was spin coated at 3000 rpm. Subsequently, the glass substrate was heated on a hot plate at 180° C. for 10 minutes to cure the compound, and thus a hole transport layer (30 nm) was formed.

[Chemical Formula 35]

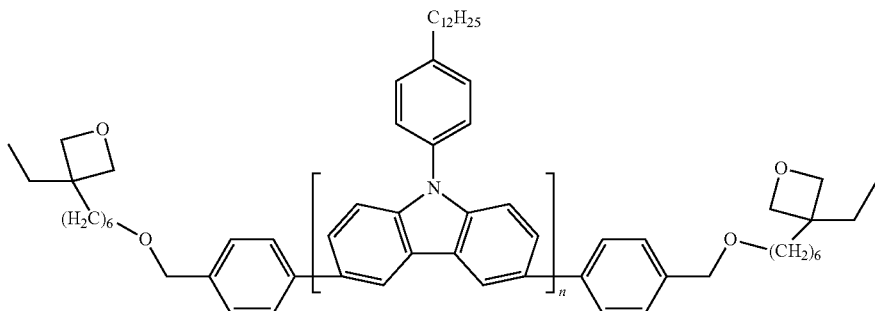

Compound 3

Subsequently, the glass substrate thus obtained was transferred into a vacuum deposition machine, and a light emitting layer was formed by depositing CBP+Ir(piq)$_3$ (40 nm), BAlq (10 nm), Alq$_3$ (30 nm), LiF (thickness 0.5 nm), and Al (thickness 100 nm) in this order.

CBP: 4,4'-Bis(carbazol-9-yl)-biphenyl
Ir(piq)$_3$: Tris(1-phenylisoquinoline)iridium
BAlq: Bis(2-methyl-8-hydroxyquinolinato)(4-biphenyloxolato)aluminum
Alq$_3$: Aluminum complex (Tris(8-hydroxyquinolinato) aluminum(III))

After the formation of electrodes, the substrate was transferred into a dry nitrogen environment without being exposed to the atmosphere, and encapsulation was carried out by pasting an encapsulating glass, which was a 0.7-mm alkali-free glass having 0.4-mm countersinks provided thereon, and an ITO substrate on the substrate using a photocurable epoxy resin. Thus, a high molecular weight organic EL element having a multilayer structure was produced. The subsequent experiment procedure was carried out at room temperature (25° C.) in air.

A voltage was applied by using the ITO of this organic EL element as a positive electrode and Al as a negative electrode, and red light emission was observed at about 4 V. The current efficiency at a luminance of 1000 cd/m$^2$ was 7.2 cd/A. The current voltage characteristics were measured with a micro-current meter 4140B manufactured by Hewlett Packard Corp., and the emission luminance was measured using a luminance meter, Pritchard 1980B, manufactured by Photo Research, Inc.

Furthermore, for the lifetime characteristics, the luminance was measured with a BM-7 manufactured by Topcon America Corp. while a constant current was applied, and the time taken for the luminance to be reduced by half from the initial luminance (1000 cd/m$^2$) was measured, which was found to be 270 hours.

(Verification of Lamination of Example 6)

A hole injection layer was formed all in the same manner, except that the ITO used in Example 6 was changed to quartz. The hole injection layer was immersed in toluene for one minute, and changes in the intensity of the absorption spectrum before and after the immersion in toluene were observed. It was found that 99.8% of the layer was remaining.

A hole transport layer was formed on the hole injection layer in the same manner as in Example 1. The hole transport layer was immersed in toluene for one minute, and changes in the intensity of the absorption spectrum before and after the immersion in toluene were observed. 97.8% of the layer was remaining.

Example 7

An organic EL element was produced in the same manner as in Example 6, except that the hole transport layer was formed without adding the polymerization initiator (0.45 mg). A voltage was applied by using the ITO of this organic EL element as a positive electrode and Al as a negative electrode, and red light emission was observed at about 3.5 V. The current efficiency at a luminance of 1000 cd/m$^2$ was 8.4 cd/A. Furthermore, the time taken for the luminance to be reduced by half from the initial luminance (1000 cd/m$^2$) was measured, and the time taken was 1020 hours.

(Verification of Lamination of Example 7)

A hole injection layer was formed all in the same manner, except that ITO used in Example 7 was changed to quartz. The hole injection layer was immersed in toluene for one minute, and changes in the intensity of the absorption spectrum before and after the immersion in toluene were observed. It was found that 99.8% of the layer was remaining.

A hole transport layer was formed on the hole injection layer in the same manner as in Example 2. The hole transport layer was immersed in toluene for one minute, and changes in the intensity of the absorption spectrum before and after the immersion in toluene were observed. 97.2% of the layer was remaining.

Comparative Example 8

An organic EL element was produced in the same manner as in Example 6, except that a hole injection layer (30 nm) was formed by using only the compound 2 (4.5 mg) instead of the compound 1 and compound 2 used in Example 6, and preparing a mixed solution with the polymerization initiator. A voltage was applied by using the ITO of this organic EL element as a positive electrode and Al as a negative electrode, and red light emission was observed at about 6V. The current efficiency at a luminance of 1000 cd/m$^2$ was 1.3 cd/A.

Furthermore, the time taken for the luminance to be reduced by half from the initial luminance (1000 cd/m$^2$) was measured, and the time taken was 12 hours.

(Verification of Lamination of Comparative Example 8)

A hole injection layer was formed all in the same manner, except that ITO used in Comparative Example 8 was changed to quartz. The hole injection layer was immersed in toluene for one minute, and changes in the intensity of the absorption spectrum before and after the immersion in toluene were observed. The film was remaining at a proportion of 2.8% only, and a laminated structure could not be produced.

When mixtures respectively containing a hole transporting compound having a polymerizable substituent are not used in two adjacent layers as in Comparative Example 8, a laminated structure cannot be produced, and the light emission efficiency and luminescence lifetime deteriorate. However, when mixtures respectively containing a hole transporting compound having a polymerizable substituent are used in two adjacent layers as shown in Examples 6 and 7, a laminated structure is easily produced, and an element having excellent light emission efficiency and an excellent luminescence lifetime can be produced. Furthermore, when a polymerization initiator is incorporated into a layer closer to the anode as in Example 7, an element having excellent light emission efficiency and an excellent luminance lifetime can be produced.

Example 8

On a glass substrate having an ITO pattern with a width of 1.6 mm, a coating solution prepared by dissolving a compound 4 (4.5 mg, Mw=7,700, Mw/Mn=1.45) shown below in toluene (1.2 ml), dissolving the above-shown polymerization initiator (0.45 mg) in ethyl acetate (100 μl), and mixing the solutions, was spin coated at 3000 rpm. Subsequently, the glass substrate was heated on a hot plate at 180° C. for 10 minutes to cure the compound, and thus a hole injection layer (30 nm) was formed.

[Chemical Formula 36]

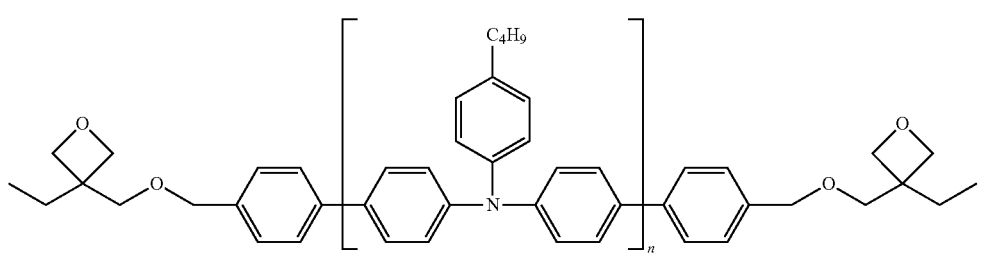

Compound 4

Subsequently, a coating solution prepared by mixing a compound 5 (4.5 mg, Mw=10,800, Mw/Mn=1.52) shown below and toluene (1.2 ml), was spin coated on the hole injection layer at 3000 rpm, and then the glass substrate was heated on a hot plate at 180° C. for 10 minutes to cure the compound. Thus, a hole transport layer (30 nm) was formed.

[Chemical Formula 37]

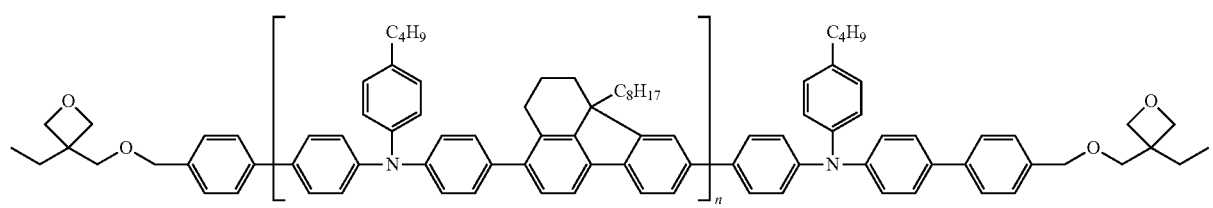

Compound 5

Subsequently, a toluene solution (1.0% by mass) of a mixture containing a polymer 1 (75 parts by mass), a polymer 2 (20 parts by mass), and a polymer 3 (5 parts by mass), which are represented by the structural formulas shown below, was spin coated on the hole transport layer at 3000 rpm, and the glass substrate was heated on a hot plate at 80° C. for 5 minutes. Thus, a polymer light emitting layer (thickness 80 nm) was formed. Meanwhile, the hole transport layer and the light emitting layer could be laminated without dissolving each other.

Furthermore, the glass substrate thus obtained was transferred into a vacuum deposition machine, and electrodes were formed on the light emitting layer in order of Ba (thickness 3 nm) and Al (thickness 100 nm).

After the formation of electrodes, the substrate was transferred into a dry nitrogen environment without being exposed to the atmosphere, and encapsulation was carried out by pasting an encapsulating glass, which was a 0.7-mm alkali-free glass having 0.4-mm countersinks provided thereon, and an ITO substrate on the substrate using a photocurable epoxy resin. Thus, a high molecular weight organic EL element having a multilayer structure was produced. The subsequent experiment procedure was carried out at room temperature (25° C.) in air.

A voltage was applied by using the ITO of this organic EL element as a positive electrode and Al as a negative electrode, and green light emission was observed at about 3.5 V. The current efficiency at a luminance of 5000 cd/m$^2$ was 8.1 cd/A, and the driving voltage was 6.1 V. Furthermore, the time taken for the luminance to be reduced by half from the initial luminance (1000 cd/m$^2$) was measured, and the time taken was 990 hours.

[Chemical Formula 38]

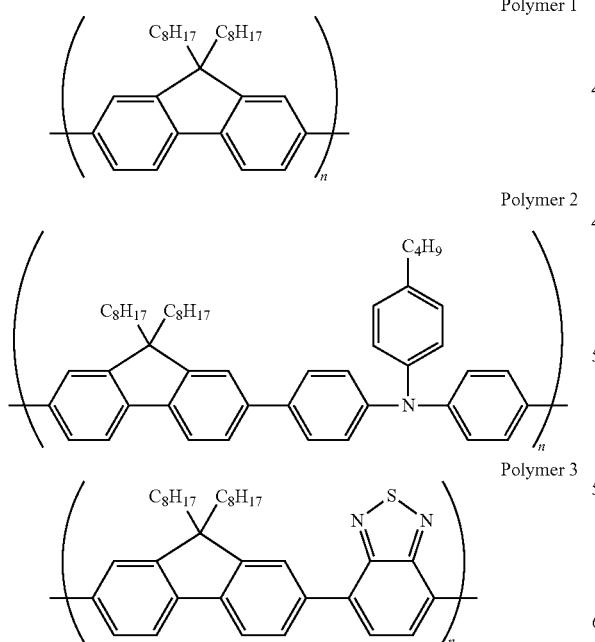

REFERENCE SIGNS LIST

1. Light emitting layer
2. Anode
3. Hole injection layer
4. Cathode
5. Electron injection layer
6. Hole transport layer
7. Electron transport layer
8. Substrate

The invention claimed is:

1. A material for organic electronics, comprising at least a first compound, the first compound being an ionic compound, and a second compound having a charge transporting unit (hereinafter, referred to as charge transporting compound),
wherein the ionic compound is composed of a counter cation and a counter anion, and the counter cation is any one kind or two or more kinds selected from H$^+$, a carbocation, a nitrogen cation, an oxygen cation, and a cation having a transition metal.

2. The material for organic electronics according to claim 1, wherein the carbocation is a tertiary carbocation.

3. The material for organic electronics according to claim 1, wherein the nitrogen cation is a tertiary or quaternary nitrogen cation.

4. The material for organic electronics according to claim 1, wherein the counter anion is any one kind or two or more kinds selected from fluorophosphoric acid ions, fluorinated alkylfluorophosphoric acid ions, boric acid ions, and fluoroantimonic acid ions.

5. The material for organic electronics according to claim 1, wherein the charge transporting compound has at least one or more structures selected from triarylamine, carbazole and thiophene.

6. The material for organic electronics according to claim 1, wherein the charge transporting compound is a polymer or oligomer containing a repeating unit which is represented by one of the following formulas (1a) to (7a), and has hole transportability:

[Chemical Formula 1]

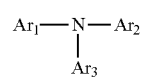 (1a)

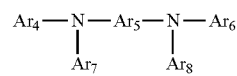 (2a)

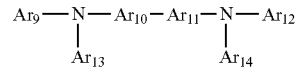 (3a)

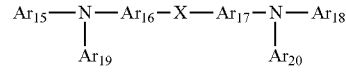 (4a)

(5a)

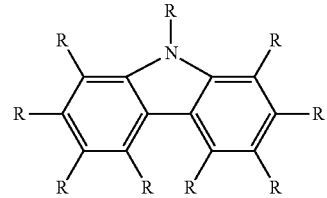

-continued

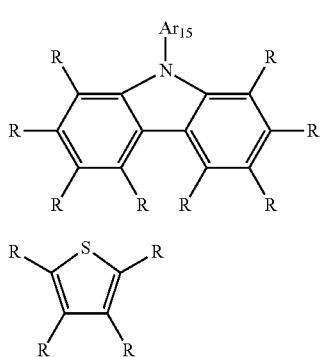

wherein Ar₁ to Ar₂₀ each independently represent an aryl group or heteroaryl group having 2 to 30 carbon atoms, or a substituted or unsubstituted arylene group or heteroarylene group; here, the aryl group means an atomic group obtained by excluding one hydrogen atom from an aromatic hydrocarbon, and a heteroaryl group means an atomic group obtained by excluding one hydrogen atom from an aromatic compound having a heteroatom, or represents R; R's each independently represent —R¹, —OR², —SR³, —OCOR⁴, —COOR⁵, —SiR⁶R⁷R⁸, or any one of formulas (2a) to (4a) (wherein R¹ to R⁸ each independently represent a hydrogen atom, a linear, cyclic or branched alkyl group having 1 to 22 carbon atoms, or an aryl group or heteroaryl group having 2 to 30 carbon atoms); here, the arylene group means an atomic group obtained by excluding two hydrogen atoms from an aromatic hydrocarbon, and the heteroarylene group means an atomic group obtained by excluding two hydrogen atoms from an aromatic compound having a heteroatom; and X represents group obtained by further removing one hydrogen atom from a group having one or more hydrogen atoms among the groups of R.

7. The material for organic electronics according to claim 1, wherein the charge transporting compound has one or more polymerizable substituents.

8. The material for organic electronics according to claim 1, wherein the ionic compound is an electron-accepting compound, and the charge transporting compound is capable of one-electron oxidation.

9. An organic electronic element comprising a layer formed by applying the material for organic electronics according to claim 1, on a substrate.

10. The organic electronic element according to claim 9, wherein the formed layer is insolubilized.

11. The organic electronic element according to claim 10, wherein film formation is further carried out on the insolubilized layer, and thereby, multilayering is achieved.

12. An organic electroluminescent element comprising a layer formed from the material for organic electronics according to claim 1.

13. An organic electroluminescent element formed by laminating at least a substrate, an anode, a hole injection layer, a polymerized layer, a light emitting layer, and a cathode, wherein the polymerized layer is a layer formed from the material for organic electronics according to claim 1.

14. An organic electroluminescent element formed by laminating at least a substrate, an anode, a polymerized layer, a hole transport layer, a light emitting layer, and a cathode, wherein the polymerized layer is a layer formed from the material for organic electronics according to claim 1.

15. The material for organic electronics according to claim 1, wherein a ratio of the ionic compound is 0.01 parts by mass to 50 parts by mass relative to 100 parts by mass of the charge transporting compound.

16. The material for organic electronics according to claim 1, wherein the counter cation is any one kind or two or more kinds selected from H*, a carbocation, a tertiary nitrogen cation, an oxygen cation, and a cation having a transition metal.

17. The material for organic electronics according to claim 1, wherein the counter cation is a tertiary nitrogen cation.

18. The material for organic electronics according to claim 1, wherein the charge transporting compound has at least one or more structures selected from carbazole and thiophene.

19. A material for organic electronics, comprising at least an ionic compound and a compound having a charge transporting unit (hereinafter, referred to as charge transporting compound),
wherein the ionic compound is composed of a counter cation and a counter anion, the ionic compound having the following formula

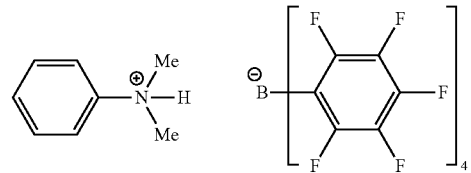

and wherein the charge transporting compound has the formula

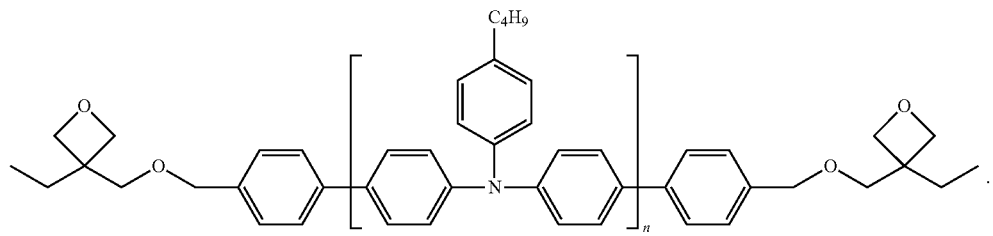

.

20. A material for organic electronics, comprising at least:
(a) an ionic compound composed of a counter cation and a counter anion, the counter cation being any one kind or two or more kinds selected from $H^+$, a carbocation, a nitrogen cation, an oxygen cation, and a cation having a transition metal, and
(b) a charge transporting compound having a charge transporting unit,
wherein the ionic compound is a different compound than the charge transporting compound.

21. An organic electroluminescent element comprising a layer formed from the material for organic electronics according to claim 20.

22. The material for organic electronics according to claim 20, wherein the charge transporting compound has at least one or more structures selected from carbazole and thiophene.

\* \* \* \* \*